United States Patent
Kozaki

(10) Patent No.: US 11,005,456 B2
(45) Date of Patent: May 11, 2021

(54) OUTPUT CIRCUIT, CIRCUIT DEVICE, OSCILLATOR, ELECTRONIC APPARATUS, AND VEHICLE

(71) Applicant: SEIKO EPSON CORPORATION, Tokyo (JP)

(72) Inventor: Minoru Kozaki, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/832,979

(22) Filed: Mar. 27, 2020

(65) Prior Publication Data

US 2020/0313658 A1 Oct. 1, 2020

(30) Foreign Application Priority Data

Mar. 28, 2019 (JP) .............................. JP2019-062584

(51) Int. Cl.
*H03K 3/027* (2006.01)
*H03K 19/20* (2006.01)
*H03B 5/36* (2006.01)

(52) U.S. Cl.
CPC ............... *H03K 3/027* (2013.01); *H03B 5/36* (2013.01); *H03K 19/20* (2013.01)

(58) Field of Classification Search
CPC ...................................................... H03K 3/27
USPC ............................................. 331/185, 116 R
See application file for complete search history.

(56) References Cited

U.S. PATENT DOCUMENTS

| 8,115,559 B2* | 2/2012 | Kim ..................... H03K 3/0322 |
| | | 331/57 |
| 8,912,853 B2* | 12/2014 | Burnette .......... H03K 3/356121 |
| | | 331/57 |
| 2008/0238565 A1* | 10/2008 | Sprouse ................... H03L 3/00 |
| | | 331/185 |
| 2014/0292425 A1 | 10/2014 | Kozaki |
| 2017/0117886 A1* | 4/2017 | Song ...................... H03K 5/135 |
| 2019/0267942 A1* | 8/2019 | Kozaki .................... H03B 5/04 |
| 2019/0333552 A1* | 10/2019 | Hong ..................... G11C 7/222 |

FOREIGN PATENT DOCUMENTS

JP 2014-192548 A 10/2014

* cited by examiner

*Primary Examiner* — Joseph Chang
(74) *Attorney, Agent, or Firm* — Rankin, Hill & Clark LLP

(57) ABSTRACT

Provided is an output circuit including a logic circuit, a capacitor, a buffer circuit, and a driver circuit. When a clock signal is input and an enable signal is active, the logic circuit outputs a clock signal based on the clock signal. The buffer circuit receives a signal that is an output signal of the logic circuit via the capacitor. The driver circuit outputs a clock signal based on a signal that is an output signal of the buffer circuit. The logic circuit sets a signal to the same logic level as an input node of the buffer circuit when the enable signal is inactive.

16 Claims, 11 Drawing Sheets

OUTPUT CIRCUIT, CIRCUIT DEVICE, OSCILLATOR, ELECTRONIC APPARATUS, AND VEHICLE

The present application is based on, and claims priority from JP Application Serial Number 2019-062584, filed Mar. 28, 2019, the disclosure of which is hereby incorporated by reference herein in its entirety.

BACKGROUND

1. Technical Field

The present disclosure relates to an output circuit, a circuit device, an oscillator, an electronic apparatus, and a vehicle.

2. Related Art

A device that outputs a clock signal, such as an oscillator, includes an output circuit that outputs the clock signal to an external device. The output circuit drives a load in a transmission path of the clock signal. The related art of the output circuit is disclosed in JP-A-2014-192548, for example.

JP-A-2014-192548 discloses an output circuit that outputs a clock signal of the PECL standard. The output circuit includes an inverter that buffers an input clock signal and an N-type transistor in which an output signal of the inverter is input to a gate. The inverter operates by a gate voltage corresponding to a high level and a low level in the clock signal of the PECL standard. The N-type transistor is provided between a power supply node and an output node of the output circuit.

In JP-A-2014-192548, since the high level and the low level in the clock signal of the PECL standard are output with reference to the power supply voltage, the high level and low level depend on the power supply voltage. On the other hand, an input clock signal is input to the inverter from an oscillation circuit in a circuit device. For example, the oscillation circuit is assumed to operate by a voltage (regulated voltage) generated by a voltage regulator that is an internal power supply of the circuit device. At this time, the inverter level-shifts the input clock signal having the same amplitude as the regulated voltage into a clock signal of the PECL standard depending on the power supply voltage. In order to obtain an appropriate clock signal after the level-shift, there is a limitation in a variation of the regulated voltage and the power supply voltage, and thus there is a problem that it is difficult to cope with various voltage specifications in the configuration in JP-A-2014-192548.

SUMMARY

An aspect of the present disclosure relates to an output circuit including: a first logic circuit receiving a first clock signal and outputting a clock signal based on the first clock signal when an enable signal is active; a first capacitor; a first buffer circuit to which a first logic circuit output signal that is an output signal of the first logic circuit is input via the first capacitor; and a driver circuit outputting a first output clock signal based on a first buffer circuit output signal that is an output signal of the first buffer circuit, in which the first logic circuit sets the first logic circuit output signal to the same logic level as a first buffer circuit input node that is an input node of the first buffer circuit when the enable signal is inactive.

DESCRIPTION OF EXEMPLARY EMBODIMENTS

Hereinafter, a desired embodiment of the present disclosure will be described in detail. Note that the present embodiment described below does not unduly limit the contents described in the scope of the appended claims, and all the configurations described in the present embodiment are not necessarily essential components.

1. Output Circuit

Figure 1:
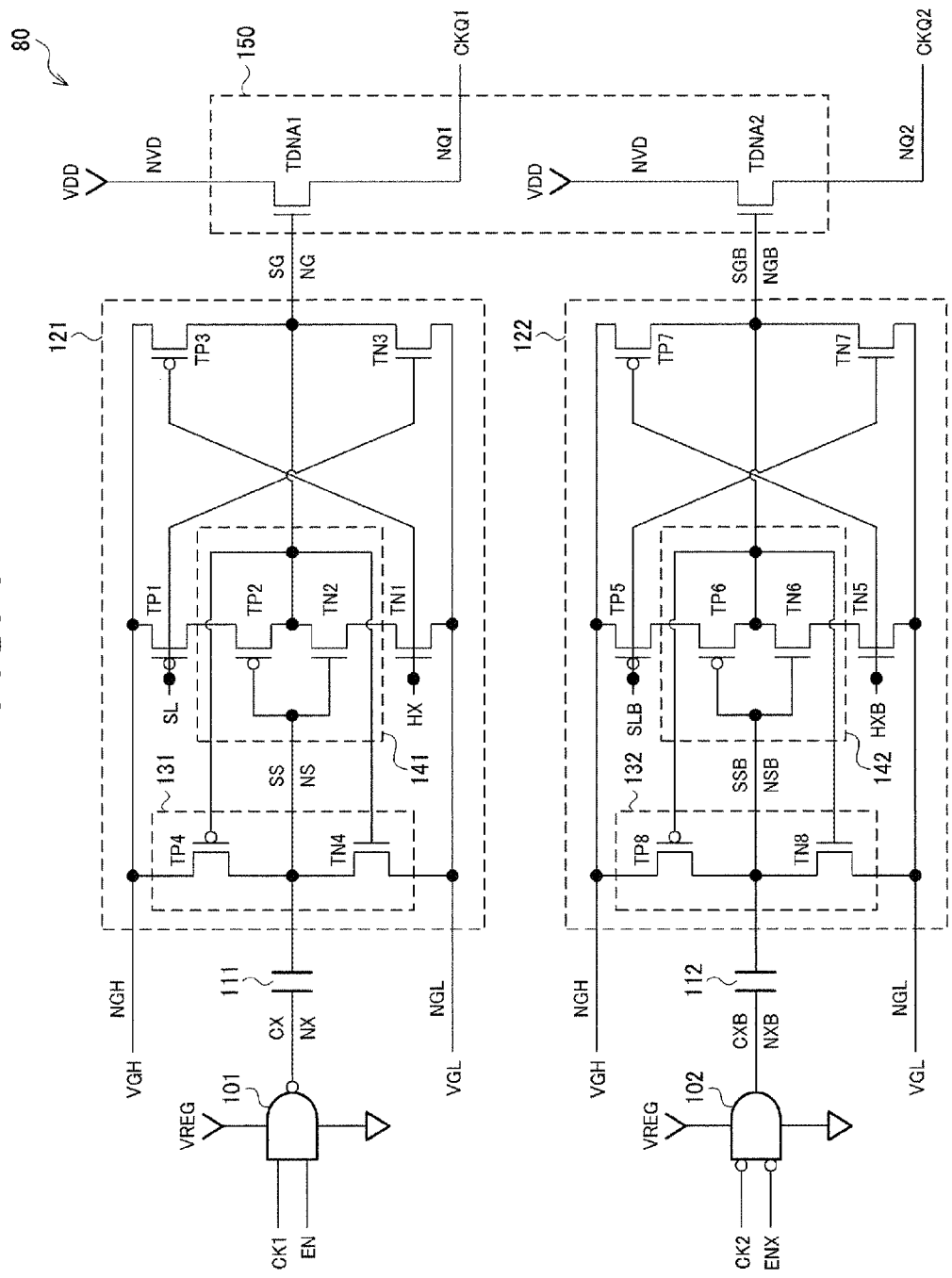
FIG. 1 shows a first configuration example of an output circuit.

FIG. 1 is a first configuration example of an output circuit 80. The output circuit 80 includes logic circuits 101 and 102, capacitors 111 and 112, buffer circuits 121 and 122, and a driver circuit 150. The logic circuits 101 and 102 are a first logic circuit and a second logic circuit, respectively. The capacitors 111 and 112 are a first capacitor and a second capacitor, respectively. The buffer circuits 121 and 122 are a first buffer circuit and a second buffer circuit, respectively.

The coupling in the present embodiment is an electrical coupling. The electrical coupling is a coupling to which an electrical signal is transmittable, and a coupling that enables transmission of information by an electrical signal. The electrical coupling may be a coupling via an active element or the like.

A clock signal CK1 and an enable signal EN are input to the logic circuit 101. The clock signal CK1 is a first clock signal. When the enable signal EN is active, the logic circuit 101 outputs a signal CX based on the clock signal CK1. The signal CX is a first logic circuit output signal. The signal CX based on the clock signal CK1 is the clock signal CK1 or a logic inverted signal of the clock signal CK1. The logic circuit 101 is, for example, a NAND circuit. That is, the logic circuit 101 outputs the NAND of the clock signal CK1 and the enable signal EN as the signal CX. In this case, the signal CX based on the clock signal CK1 is a logic inverted signal of the clock signal CK1.

A signal CX is input to the buffer circuit 121 via the capacitor 111. That is, one end of the capacitor 111 is coupled to an output node NX of the logic circuit 101, and the other end of the capacitor 111 is coupled to an input node NS of the buffer circuit 121. The input node NS is a first buffer circuit input node. The logic circuit 101 outputs the signal CX to the one end of the capacitor 111, so that a signal SS is input from the other end of the capacitor 111 to the input node NS. The buffer circuit 121 outputs a signal SG by buffering the signal SS. The signal SG is a first buffer circuit output signal and is a logic inverted signal of the signal SS.

The driver circuit 150 outputs a clock signal CKQ1 based on the signal SG. The clock signal CKQ1 is a first output clock signal. The driver circuit 150 includes an N-type transistor TDNA1 provided between a power supply node NVD and an output node NQ1. The output node NQ1 is a first output node. The N-type transistor TDNA1 is a first driver N-type transistor. A drain of the N-type transistor TDNA1 is coupled to the power supply node NVD, a source is coupled to the output node NQ1, and a gate is coupled to the output node NG of the buffer circuit 121. Letting Vth denote a threshold voltage of TDNA1, the high level of the clock signal CKQ1 is VGH−Vth−ΔVH, and the low level is VGL−Vth−ΔVL. ΔVH and ΔVL are voltages (overdrive voltage) belonging to a current value flowing through TDNA1.

The logic circuit 101 is supplied with a regulated voltage VREG from a voltage regulator 90 described later in FIG. 10, and the logic circuit 101 operates using the regulated voltage VREG as a power supply voltage. That is, the high level of the signal CX output from the logic circuit 101 is the regulated voltage VREG, and the low level of the signal CX is a ground voltage.

The buffer circuit 121 is supplied with voltages VGH and VGL from a voltage generation circuit 85 described later in FIG. 10, and the buffer circuit 121 operates using the voltages VGH and VGL as power supply voltages. The voltage VGH is a first voltage, the voltage VGL is a second voltage, and their magnitude relation is VGH>VGL. The clock signal CKQ1 is a clock signal of the positive emitter coupled logic (PECL) standard, and the logic level thereof is defined with reference to a power supply voltage VDD. The high level of the clock signal CKQ1 in the PECL standard is denoted as VDD-αH, and the low level is denoted as VDD-αL. At this time, it is expressed as VGH=VDD−αH+Vth+AαVH and VGL=VDD−αL+Vth+αNL because VGH−Vt−αVH=VDD−αH and VGL−Vth−αVL=VDD−αL. That is, the high level of the signal SG output from the buffer circuit 121 is the voltage VGH=VDD−αH+Vth+αVH, and the low level is the voltage VGL=VDD−αL+Vth+αVL.

In the present embodiment, the capacitor 111 is provided between the logic circuit 101 and the buffer circuit 121, and the logic circuit 101 outputs the signal CX to the buffer circuit 121 via the capacitor 111. Thereby, the capacitor 111 cuts a DC component of the signal CX, so that there is no level-shift from the regulated voltage VREG and the ground voltage to the voltages VGH and VGL between the input and output of the buffer circuit 121. Therefore, variation of the regulated voltage VREG and the voltages VGH and VGL can be freely set as compared with a case where the level-shift is performed. Although VGH and VGL depend on the power supply voltage VDD as described above, since the voltages VGH and VGL can be freely set independently to the regulated voltage VREG, the combination of the power supply voltage VDD and the regulated voltage VREG also can be freely set according to various voltage specifications required.

When a DC cut is performed by the capacitor 111 as in the present embodiment, a signal logic level needs to be the same at both ends of the capacitor 111 in order to obtain an appropriate clock signal CKQ1.

Therefore, in the present embodiment, the logic circuit 101 sets the signal CX to the same logic level as the signal SS when the enable signal EN is inactive. Specifically, when the enable signal EN is inactive, the logic circuit 101 outputs the signal CX with a high level, and the buffer circuit 121 sets the signal SS of the input node NS to a high level. When the enable signal EN changes from inactive to active, the logic circuit 101 outputs the clock signal CK1 as the signal CX, but since the signal CX and the signal SS start from the same logic level at both ends of the capacitor 111, an appropriate logic level signal is transmitted. Thereby, an appropriate clock signal CKQ1 is obtained. Details of this point will be described later with reference to FIG. 3.

Further, when the DC cut is performed by the capacitor 111 as in the present embodiment, there is a possibility that the other end of the capacitor 111 is momentarily in an unstable state when the clock signal CK1 has a low frequency. When the other end of the capacitor 111 is momentarily in the unstable state, there is a possibility that an appropriate clock signal CKQ1 cannot be obtained.

Therefore, in the present embodiment, the buffer circuit 121 includes an inverter 141 and a latch circuit 131.

The signal CX from the logic circuit 101 is input to the inverter 141 via the capacitor 111. That is, the signal SS at the other end of the capacitor 111 is input to the inverter 141. The inverter 141 outputs a logic inverted signal of the signal SS as the signal SG.

The latch circuit 131 performs a latch operation by setting the input node NS of the buffer circuit 121 to a logic inversion level of an output signal of the inverter 141. That is, the latch circuit 131 sets the signal SS at the other end of the capacitor 111 to a high level when the signal SG that is the output signal of the inverter 141 is at a low level, and sets the signal SS to a low level when the signal SG is at a high level.

According to the present embodiment, the latch circuit 131 performs a latch operation, so that the signal SS at the other end of the capacitor 111 is set. Thereby, even when the clock signal CK1 has a low frequency, the other end of the capacitor 111 does not enter the unstable state, so that an appropriate clock signal CKQ1 is obtained.

As described above, according to the present embodiment, the power supply voltage VDD can adapt to various voltage specifications by providing the capacitor 111. Further, by making the signal logic level the same at both ends of the capacitor 111 and providing the latch circuit 131, an appropriate clock signal CKQ1 can be output.

Next, the logic circuit 102 and the buffer circuit 122 will be described. In FIG. 1, the output circuit 80 outputs differential clock signals CKQ1 and CKQ2, but the output circuit 80 may output a single-ended clock signal CKQ1 as will be described later with reference to FIG. 6. In that case, the logic circuit 102, the buffer circuit 122, and the N-type transistor TDNA2 can be omitted.

A clock signal CK2 and an inverted enable signal ENX are input to the logic circuit 102. The clock signal CK2 is a second clock signal. The inverted enable signal ENX is a logic inverted signal of the enable signal EN. When the enable signal EN is active, the logic circuit 102 outputs the clock signal CK2 as a signal CXB. The signal CXB is a second logic circuit output signal. The signal CXB based on the clock signal CK2 is the clock signal CK2 or a logic inverted signal of the clock signal CK2. The logic circuit 102 is, for example, a NOR circuit. That is, the logic circuit 102 outputs the NOR of the clock signal CK2 and the inverted enable signal ENX as the signal CXB. In this case, the signal CXB based on the clock signal CK2 is a logic inverted signal of the clock signal CK2.

The signal CXB is input to the buffer circuit 122 via the capacitor 112. That is, one end of the capacitor 112 is coupled to the output node NXB of the logic circuit 102, and the other end of the capacitor 112 is coupled to the input node NSB of the buffer circuit 122. The input node NSB is a second buffer circuit input node. The logic circuit 102 outputs the signal CXB to the one end of the capacitor 112, so that the signal SSB is input from the other end of the capacitor 112 to the input node NSB. The buffer circuit 122 outputs a signal SGB by buffering the signal SSB. The signal SGB is a second buffer circuit output signal and is a logic inverted signal of the signal SSB.

The driver circuit 150 outputs a clock signal CKQ2 based on the signal SGB. The clock signal CKQ2 is a second output clock signal and is a logic inverted signal of the clock signal CKQ1. The driver circuit 150 includes an N-type transistor TDNA2 provided between a power supply node NVD and an output node NQ2. The output node NQ2 is a second output node. The N-type transistor TDNA2 is a second driver N-type transistor. A drain of the N-type transistor TDNA2 is coupled to the power supply node NVD, a source is coupled to the output node NQ2, and a gate is coupled to the output node NGB of the buffer circuit 122.

The logic circuit 102 operates using the regulated voltage VREG as a power supply voltage. The buffer circuit 122 operates using the voltages VGH and VGL as power supply voltages. The clock signals CKQ1 and CKQ2 are differential clock signals of the PECL standard.

The logic circuit 102 sets the signal CXB to the same logic level as the signal SSB when the enable signal EN is inactive. Specifically, when the enable signal EN is inactive, the logic circuit 102 outputs a low level signal CXB, and the buffer circuit 122 sets the signal SSB of the input node NSB to a low level. The input node NSB is a second buffer circuit input node.

Specifically, the buffer circuit 122 includes an inverter 142 and a latch circuit 132.

The signal CXB from the logic circuit 102 is input to the inverter 142 via the capacitor 112. That is, the signal SSB at the other end of the capacitor 112 is input to the inverter 142. The inverter 142 outputs a logic inverted signal of the signal SSB as the signal SGB.

The latch circuit 132 performs a latch operation by setting the input node NSB of the buffer circuit 122 to a logic inversion level of an output signal of the inverter 142. That is, the latch circuit 132 sets the signal SSB at the other end of the capacitor 112 to a high level when the signal SGB that is an output signal of the inverter 142 is at a low level, and sets the signal SSB to a low level when the signal SGB is at a high level.

According to the present embodiment described above, the power supply voltage VDD can adapt to various voltage specifications by providing the capacitor 112. Further, by making the signal logic level the same at both ends of the capacitor 112 and providing the latch circuit 132, an appropriate clock signal CKQ2 can be output.

Next, the operation of the output circuit 80 will be described with reference to the timing diagrams shown in FIGS. 2 and 3. In the following, active is set to a high level and inactive is set to a low level, but the correspondence between the active and the logic levels is not limited to this. Hereinafter, the low level is also referred to as "L", and the high level is also referred to as "H".

Figure 2:
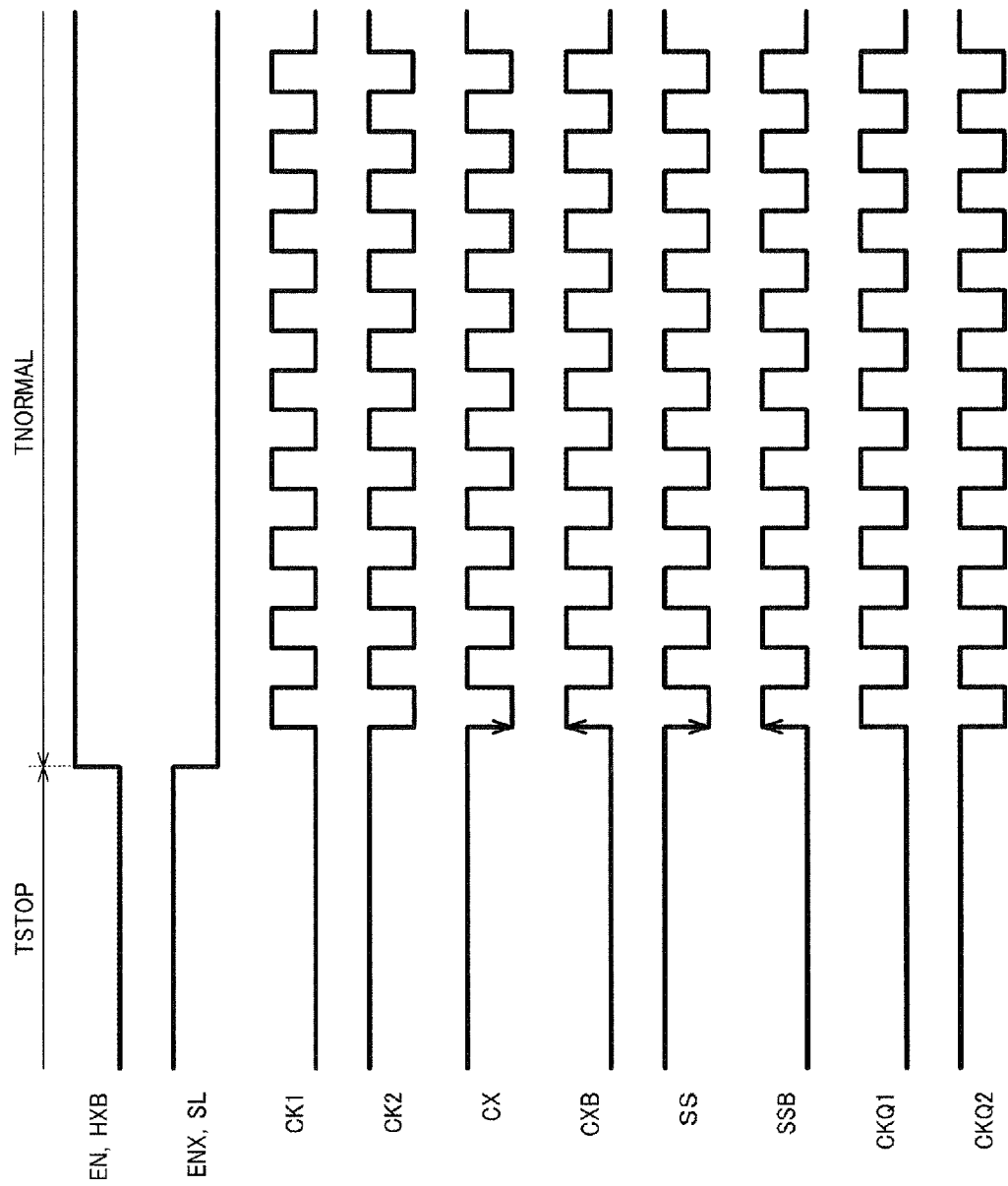
FIG. 2 is a timing diagram showing an operation of the output circuit.

FIG. 2 is a timing diagram of the output circuit 80 shown in FIG. 1. A period in which outputs of the clock signals CKQ1 and CKQ2 become a stopped state is referred to as an output stop period TSTOP. Further, a period in which the clock signals CKQ1 and CKQ2 are in an output state is referred to as a normal operation period TNORMAL.

In the output stop period TSTOP, it is set to EN=HXB=L and ENX=SL=H. Note that signals HXB and SL are signals for fixing the logic levels of the clock signals CKQ1 and CKQ2 in the output stop period TSTOP. Here, an outline of a fixing function will be described, and an implementation configuration of the fixing function will be described when a detailed configuration of the buffer circuit will be described later.

When EN=L, the logic circuit 101 outputs CX=H. When ENX=H, the logic circuit 102 outputs CXB=L. In FIG. 2, it is expressed as CK1=L and CK2=H in the output stop period TSTOP, but it is set to CX=H and CXB=L regardless of the logic levels of CK1 and CK2.

In the output stop period TSTOP, the latch circuit 131 sets the other end of the capacitor 111 to SS=H. Specifically, when SL=H, the output node NG is fixed at SG=L by the buffer circuit 121. Since the output signal of the inverter 141 becomes SG=L, the latch circuit 131 sets SS=H obtained by logically inverting SG=L to the other end of the capacitor 111. Thereby, it is set to CX=SS=H, and the logic levels are the same at both ends of the capacitor 111. In the output stop period TSTOP, the buffer circuit 122 sets the other end of the capacitor 112 to SSB=L. Specifically, when HXB=L, the output node NGB is fixed at SGB=H by the buffer circuit 122. Since the output signal of the inverter 142 becomes SGB=H, the latch circuit 132 sets SSB=L obtained by logically inverting SGB=H to the other end of the capacitor 112. Thereby, it is set to CXB=SSB=L, and the logic levels are the same at both ends of the capacitor 112.

When SG=L, the driver circuit 150 outputs CKQ1=L. Further, when SG=H, the driver circuit 150 outputs CKQ2=H. In this way, the logic levels of the signals SG and SGB, which are output signals of the buffer circuits 121 and 122, are fixed by the signals HXB and SL, so that the logic levels of the clock signals CKQ1 and CKQ2 are fixed.

In the normal operation period TNORMAL, it is set to EN=HXB=H and ENX=SL=L. At this time, the logic circuit 101 outputs a logic inverted signal of the clock signal CK1 as the signal CX. The logic circuit 102 outputs a logic inverted signal of the clock signal CK2 as the signal CXB.

The signal SS is a logic inverted signal of the clock signal CK1 as with the signal CX. Since the inverter 141 outputs the logic inverted signal of the signal SS, the inverter 141 outputs a signal SG having the same logic level as that of the clock signal CK1. The driver circuit 150 outputs a clock signal CKQ1 having the same logic level as that of the signal SG, that is, the same logic level as that of the clock signal CK1. Further, the signal SSB is a logic inverted signal of the clock signal CK2 as with the signal CXB. Since the inverter 142 outputs the logic inverted signal of the signal SSB, the inverter 142 outputs a signal SGB having the same logic level as that of the clock signal CK2. The driver circuit 150 outputs a clock signal CKQ2 having the same logic level as that of the signal SGB, that is, the same logic level as that of the clock signal CK2.

As described above, since it is set to CX=SS=H at both ends of the capacitor 111 in the output stop period TSTOP, when the signal CX first changes from the high level to the low level in the normal operation period TNORMAL, the signal SS also changes from the high level to the low level. Similarly, since it is set to CXB=SSB=L at both ends of the capacitor 112 in the output stop period TSTOP, when the signal CXB first changes from the low level to the high level in the normal operation period TNORMAL, the signal SSB also changes from the low level to the high level. As described above, by making the logic levels of both ends of the capacitors 111 and 112 the same in the output stop period TSTOP, it is possible to appropriately transmit the signals in the normal operation period TNORMAL.

Figure 3:
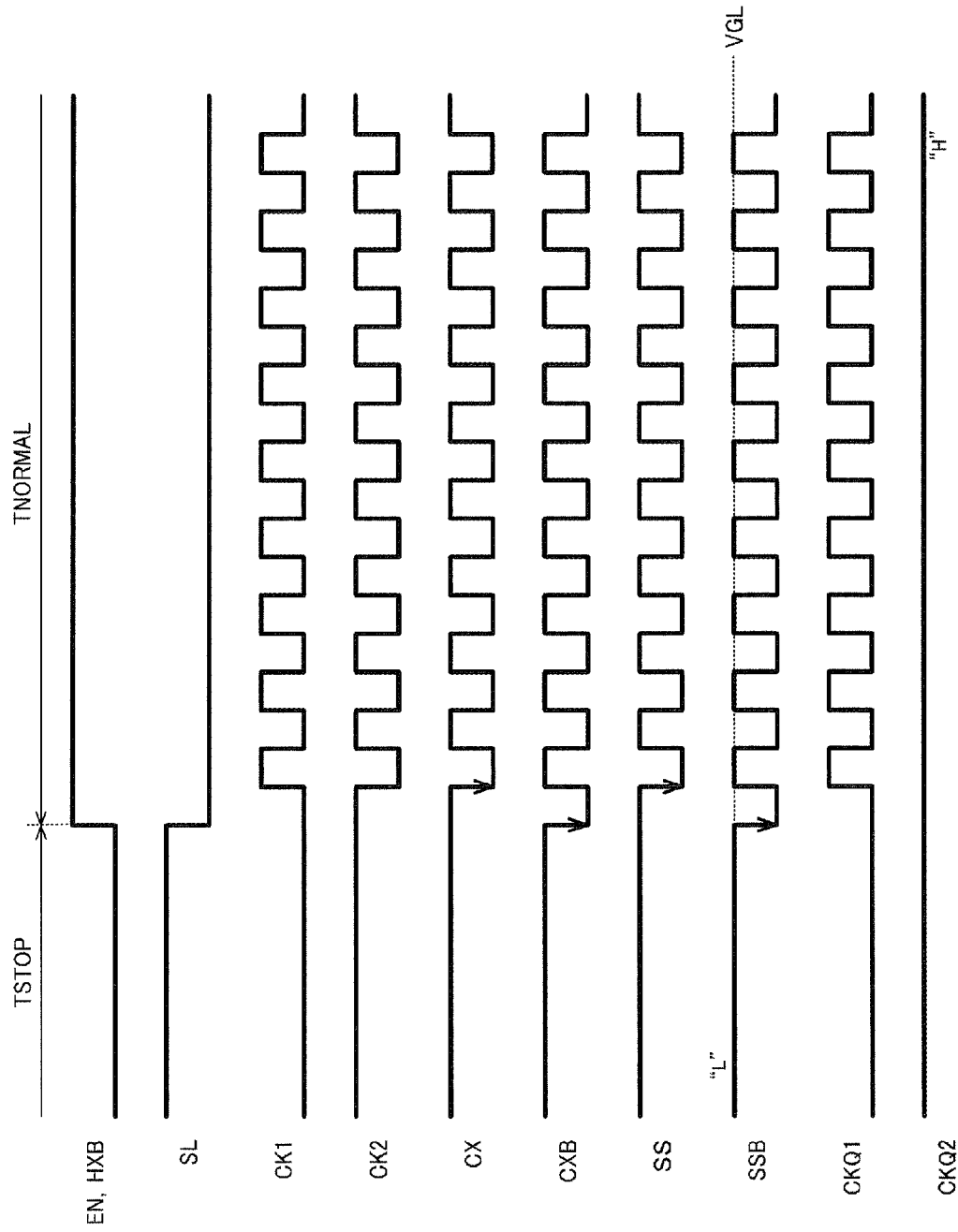
FIG. 3 is a timing diagram of a comparative example with respect to the present embodiment.

FIG. 3 is a timing diagram of a comparative example with respect to the present embodiment. FIG. 3 shows the timing diagram when both the logic circuit 101 and the logic circuit 102 in FIG. 1 are NAND circuits. It is assumed that the clock signal CK2 and the enable signal EN are input to the logic circuit 102.

As shown in FIG. 3, in the output stop period TSTOP, the logic circuit 102 outputs CXB=H. As described in FIG. 2, since SGB=H is fixed by the signal HXB, SSB=L is set by the latch circuit 132. That is, although one end of the capacitor 112 is set to CXB=H, the other end of the capacitor 112 is set to SSB=L, and the logic levels are different at both ends of the capacitor 112.

In this case, when the signal CXB first changes from the high level to the low level in the normal operation period TNORMAL, the signal SSB at the other end of the capacitor 112 is further lowered from the low level. That is, the signal SSB becomes a voltage lower than the voltage VGL. Even when the signal CXB becomes the high level, the signal SSB keeps the low level, that is, it only returns to the voltage VGL. Therefore, the signal SSB is always equal to or lower than the voltage VGL. Since the inverter 142 to which the signal SSB is input outputs the signal SGB at a high level, the signal SGB is fixed to the high level and the clock signal CKQ2 is fixed to the high level.

As described above, in the comparative example, since the logic levels are different at both ends of the capacitor 112 in the output stop period TSTOP, an appropriate clock signal CKQ2 cannot be obtained in the normal operation period TNORMAL. On the other hand, according to the output circuit 80 of the present embodiment described in FIG. 2, since the logic levels are the same at both ends of the capacitors 111 and 112 in the output stop period TSTOP, appropriate clock signals CKQ1 and CKQ2 are obtained in the normal operation period TNORMAL.

Next, returning to FIG. 1, a detailed configuration example of the buffer circuits 121 and 122 will be described. First, a detailed configuration example of the buffer circuit 121 will be described.

Inverter 141 includes the P-type transistor TP2 and the N-type transistor TN2. The latch circuit 131 includes the P-type transistor TP4 and the N-type transistor TN4. The buffer circuit 121 further includes the P-type transistors TP1 and TP3 and the N-type transistors TN1 and TN3. TP1 to TP4 are the first to fourth P-type transistors, and TN1 to TN4 are the first to fourth N-type transistors.

The P-type transistors TP1 and TP2 are coupled in series between a node NGH and an output node NG. The node NGH is a first voltage node to which the voltage VGH is input. The output node NG is a first buffer circuit output node. Specifically, a source of the P-type transistor TP1 is coupled to the node NGH, and a drain of the P-type transistor TP1 is coupled to the source of the P-type transistor TP2. The drain of the P-type transistor TP2 is coupled to the output node NG.

The N-type transistors TN1 and TN2 are coupled in series between node NGL and output node NG. The node NGL is a second voltage node to which voltage VGL is input. Specifically, a source of the N-type transistor TN1 is coupled to the node NGL, and a drain of the N-type transistor TN1 is coupled to the source of the N-type transistor TN2. The drain of the N-type transistor TN2 is coupled to the output node NG.

The P-type transistor TP3 is provided between the node NGH and the output node NG. Specifically, a source of the P-type transistor TP3 is coupled to the node NGH, and a drain of the P-type transistor TP3 is coupled to the output node NG.

The N-type transistor TN3 is provided between the node NGL and the output node NG. Specifically, a source of the N-type transistor TN3 is coupled to the node NGL, and a drain of the N-type transistor TN3 is coupled to the output node NG.

The P-type transistor TP4 is provided between the node NGH and the input node NS. Specifically, a source of the P-type transistor TP4 is coupled to the node NGH, and a drain of the P-type transistor TP4 is coupled to the input node NS.

The N-type transistor TN4 is provided between the node NGL and the input node NS. Specifically, a source of the N-type transistor TN4 is coupled to the node NGL, and a drain of the N-type transistor TN4 is coupled to the input node NS.

The logic circuit 101 outputs the signal CX to gates of the P-type transistor TP2 and the N-type transistor TN2 via the capacitor 111. Thereby, the signal CX is input to the inverter 141 via the capacitor 111.

A signal SL is input to gates of the P-type transistor TP1 and the N-type transistor TN3. The signal SL is a first output enable signal. As shown in FIG. 2, the signal SL is at a high level when the enable signal EN is at a low level, and the signal SL is at a low level when the enable signal EN is at a high level. A high level signal HX is input to gates of the N-type transistor TN1 and the P-type transistor TP3. The signal HX is at a high level both in the output stop period TSTOP and the normal operation period TNORMAL.

In the output stop period TSTOP, since it is set to SL=H and HX=H, TP1 and TP3 are OFF and TN1 and TN3 are ON. Since TP1 is OFF, it becomes a high impedance between the output node NG of the inverter 141 and the node NGH. Further, since TP3 is OFF and TN3 is ON, the output node NG is fixed at SG=L thereby it becomes as CKQ1=L.

In the normal operation period TNORMAL, since it is set to SL=L and HX=H, TP1 and TN1 are ON and TP3 and TN3 are OFF. Since TP1 and TN1 are ON, the inverter 141 is in an operating state. Further, since TP3 and TN3 are OFF, the logic level of the signal SG is not fixed, and the inverter 141 outputs the signal SG.

The gates of the P-type transistor TP4 and the N-type transistor TN4 are coupled to the output node NG. That is, the signal SG is input to the gates of TP4 and TN4. Since TP4 is ON and TN4 is OFF when SG=L, the input node NS is set to SS=H via TP4. Since TP4 is OFF and TN4 is ON when SG=H, the input node NS is set to SS=L via TN4. In this way, the function of the latch circuit 131 is realized.

Second, a detailed configuration example of the buffer circuit 122 will be described. Inverter 142 includes a P-type transistor TP6 and an N-type transistor TN6. The latch circuit 132 includes a P-type transistor TP8 and an N-type transistor TN8. The buffer circuit 122 further includes P-type transistors TP5 and TP7 and N-type transistors TN5 and TN7. TP5 to TP8 are fifth to eighth P-type transistors, and TN5 to TN8 are fifth to eighth N-type transistors.

The P-type transistors TP5 and TP6 are coupled in series between node NGH and output node NGB. The output node NGB is a second buffer circuit output node. Specifically, a source of the P-type transistor TP5 is coupled to the node NGH, and a drain of the P-type transistor TP5 is coupled to the source of the P-type transistor TP6. The drain of the P-type transistor TP6 is coupled to the output node NGB.

The N-type transistors TN5 and TN6 are coupled in series between node NGL and output node NGB. Specifically, a source of the N-type transistor TN5 is coupled to the node NGL, and a drain of the N-type transistor TN5 is coupled to the source of the N-type transistor TN6. The drain of the N-type transistor TN6 is coupled to the output node NGB.

The P-type transistor TP7 is provided between the node NGH and the output node NGB. Specifically, a source of the P-type transistor TP7 is coupled to the node NGH, and a drain of the P-type transistor TP7 is coupled to the output node NGB.

The N-type transistor TN7 is provided between the node NGL and the output node NGB. Specifically, a source of the N-type transistor TN7 is coupled to the node NGL, and a drain of the N-type transistor TN7 is coupled to the output node NGB.

The P-type transistor TP8 is provided between the node NGH and the input node NSB. Specifically, a source of the P-type transistor TP8 is coupled to the node NGH, and a drain of the P-type transistor TP8 is coupled to the input node NSB.

The N-type transistor TN8 is provided between the node NGL and the input node NSB. Specifically, a source of the N-type transistor TN8 is coupled to the node NGL, and a drain of the N-type transistor TN8 is coupled to the input node NSB.

The logic circuit 102 outputs the signal CXB to the gates of the P-type transistor TP6 and the N-type transistor TN6 via the capacitor 112. Thereby, the signal CXB is input to the inverter 142 via the capacitor 112.

A low level signal SLB is input to the gates of the P-type transistor TP5 and the N-type transistor TN7. The signal SLB is at a low level both in the output stop period TSTOP and the normal operation period TNORMAL. The signal HXB is input to the gates of the N-type transistor TN5 and the P-type transistor TP7. The signal HXB is a second output enable signal. As shown in FIG. 2, the signal HXB is at a low level when the enable signal EN is at a low level, and the signal HXB is at a high level when the enable signal EN is at a high level.

In the output stop period TSTOP, since it is set to SLB=L and HXB=L, TP5 and TP7 are ON and TN5 and TN7 are OFF. Since TN5 is OFF, it becomes a high impedance between the output node NGB of the inverter 142 and the node NGL. Since TP7 is ON and TN7 is OFF, the output node NGB is fixed at SGB=H thereby it becomes as CKQ2=H.

In the normal operation period TNORMAL, since it is set to SLB=L and HXB=H, TP5 and TN5 are ON and TP7 and TN7 are OFF. Since TP5 and TN5 are ON, the inverter 142 is in an operating state. Further, since TP7 and TN7 are OFF, the logic level of the signal SGB is not fixed and the inverter 142 outputs the signal SGB.

The gates of the P-type transistor TP8 and the N-type transistor TN8 are coupled to the output node NGB. That is, the signal SGB is input to the gates of TP8 and TN8. Since TP8 is ON and TN8 is OFF when SGB=L, the input node NSB is set to SSB=H via TP8. Since TP8 is OFF and TN8 is ON when SGB=H, the input node NSB is set to SSB=L via TN8. In this way, the function of the latch circuit 132 is realized.

2. Detailed Configuration Example of Logic Circuit

Figure 4:
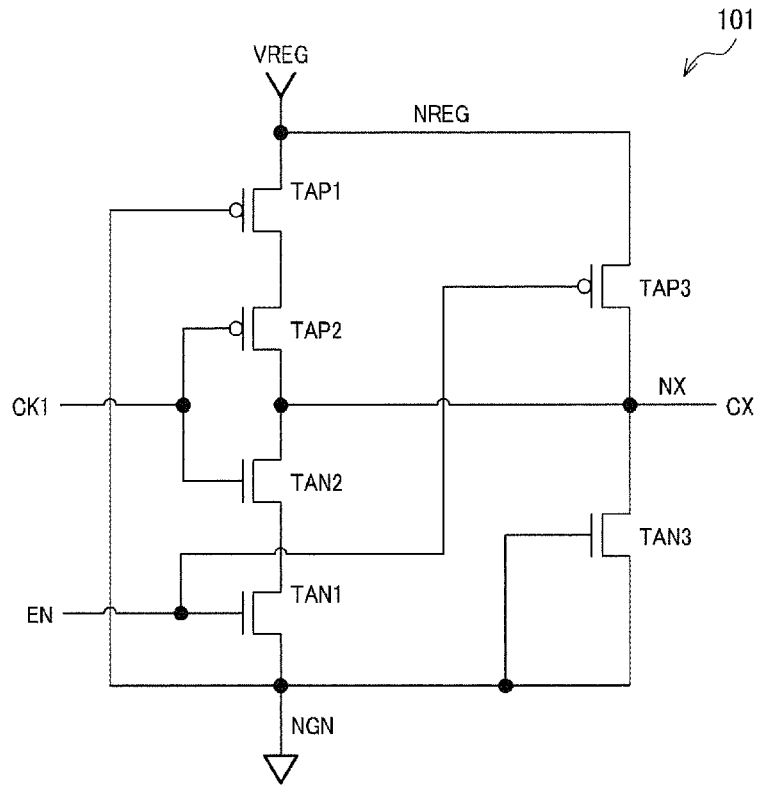
FIG. 4 is a detailed configuration example of a logic circuit.
Figure 5:
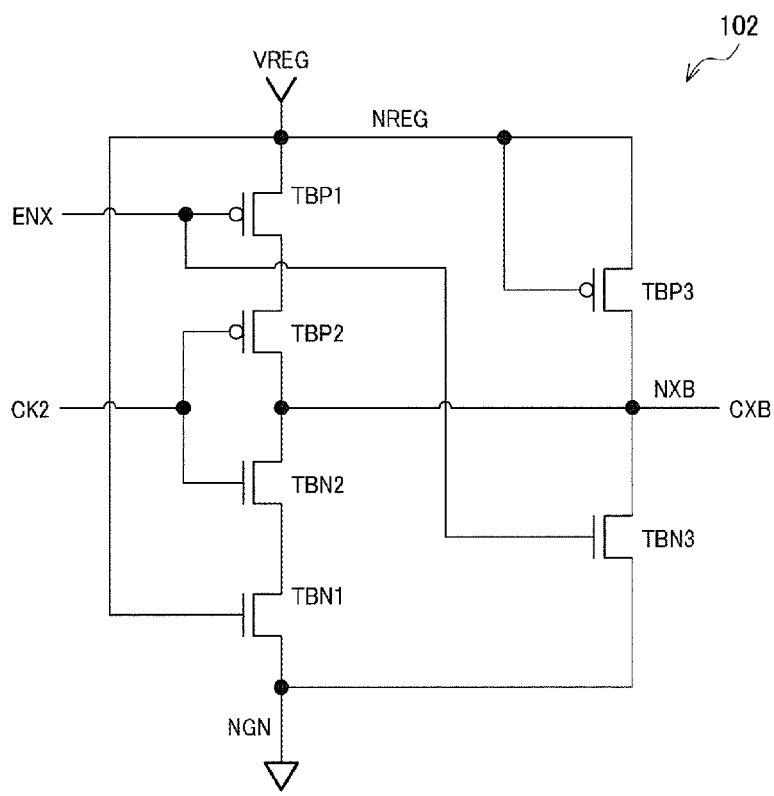
FIG. 5 is a detailed configuration example of a logic circuit.

FIG. 4 is a detailed configuration example of the logic circuit 101. FIG. 5 is a detailed configuration example of the logic circuit 102. As described above, the logic circuit 101 is a NAND circuit, and the logic circuit 102 is a NOR circuit.

As shown in FIG. 4, the logic circuit 101 includes P-type transistors TAP1 to TAP3 and N-type transistors TAN1 to TAN3.

The P-type transistors TAP1 and TAP2 are coupled in series between a node NREG and an output node NX. The regulated voltage VREG is supplied to the node NREG. The N-type transistors TAN1 and TAN2 are coupled in series between ground node NGN and output node NX. The P-type transistor TAP3 is coupled between the node NREG and the output node NX. The N-type transistor TAN3 is coupled between the ground node NGN and the output node NX.

The clock signal CK1 is input to gates of the P-type transistor TAP2 and the N-type transistor TAN2. A ground voltage is input to gates of the P-type transistor TAP1 and the N-type transistor TAN3. The enable signal EN is input to gates of the N-type transistor TAN1 and the P-type transistor TAP3.

The P-type transistor TAP1 is ON and the N-type transistor TAN3 is OFF. Thereby, the P-type transistors TAP2 and TAP3 and the N-type transistors TAN1 and TAN2 have a configuration equivalent to a NAND circuit.

As shown in FIG. 5, the logic circuit 102 includes P-type transistors TBP1 to TBP3 and N-type transistors TBN1 to TBN3. Since the circuit configuration is the same as that in FIG. 4, description will be omitted. However, a signal input to a gate of each transistor is different from that in FIG. 4.

That is, the clock signal CK2 is input to gates of the P-type transistor TBP2 and the N-type transistor TBN2. The regulated voltage VREG is input to gates of the N-type transistor TBN1 and the P-type transistor TBP3. The inverted enable signal ENX is input to gates of the P-type transistor TBP1 and the N-type transistor TAN3.

The N-type transistor TBN1 is ON and P-type transistor TBP3 is OFF. Thereby, the P-type transistors TBP1 and TBP2 and the N-type transistors TBN2 and TBN3 have a configuration equivalent to the NOR circuit.

According to the detailed configuration examples in FIG. 4 and FIG. 5, the logic circuit 101 that is a NAND circuit and the logic circuit 102 that is a NOR circuit can be realized by a circuit having the same configuration. Accordingly, a propagation delay of the clock signal CK1 in the logic circuit 101 and a propagation delay of the clock signal CK2 in the logic circuit 102 can be made the same. Since the propagation delays of the clock signals CK1 and CK2 are even, the characteristics of the clock signals CKQ1 and CKQ2 that are differential clock signals can be improved. For example, an accurate cross point in the differential clock signal can be realized.

3. Second to Fourth Configuration Examples of Output Circuit

The configuration of the output circuit 80 is not limited to that shown in FIG. 1, and various configurations according to the standard of the clock signal can be assumed. Hereinafter, examples are shown below. In the following, the components already described are denoted by the same reference numerals, and description of the components is appropriately omitted.

Figure 6:
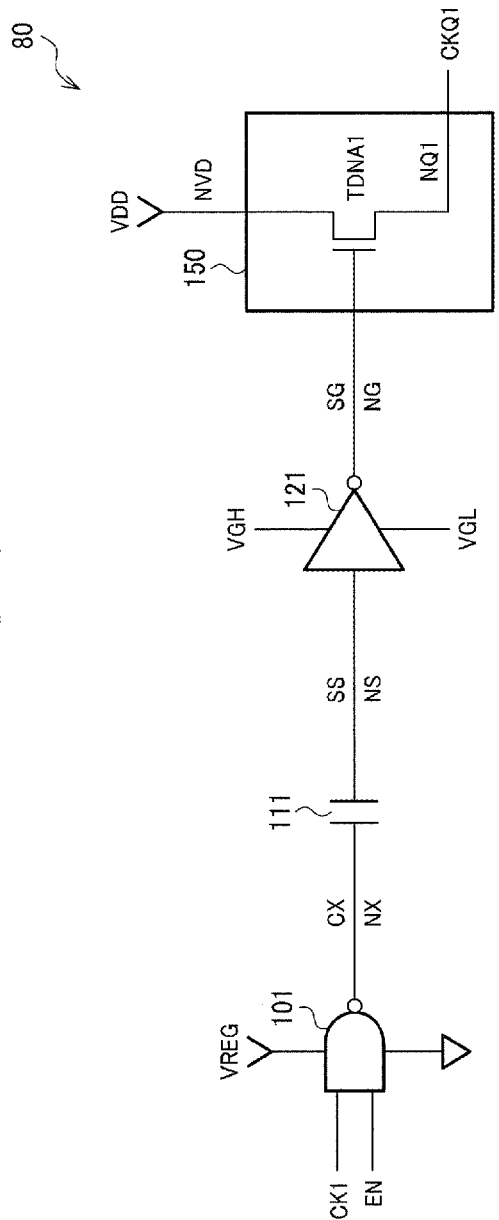
FIG. 6 shows a second configuration example of the output circuit.

FIG. 6 is a second configuration example of the output circuit 80. In FIG. 6, the output circuit 80 is a clock signal of the PECL standard and outputs a single-ended clock signal.

The output circuit 80 includes a logic circuit 101, a capacitor 111, a buffer circuit 121, and a driver circuit 150. The driver circuit 150 includes an N-type transistor TDNA1. Since these configurations and operations are as described with reference to FIG. 1, the description will be omitted.

Figure 7:
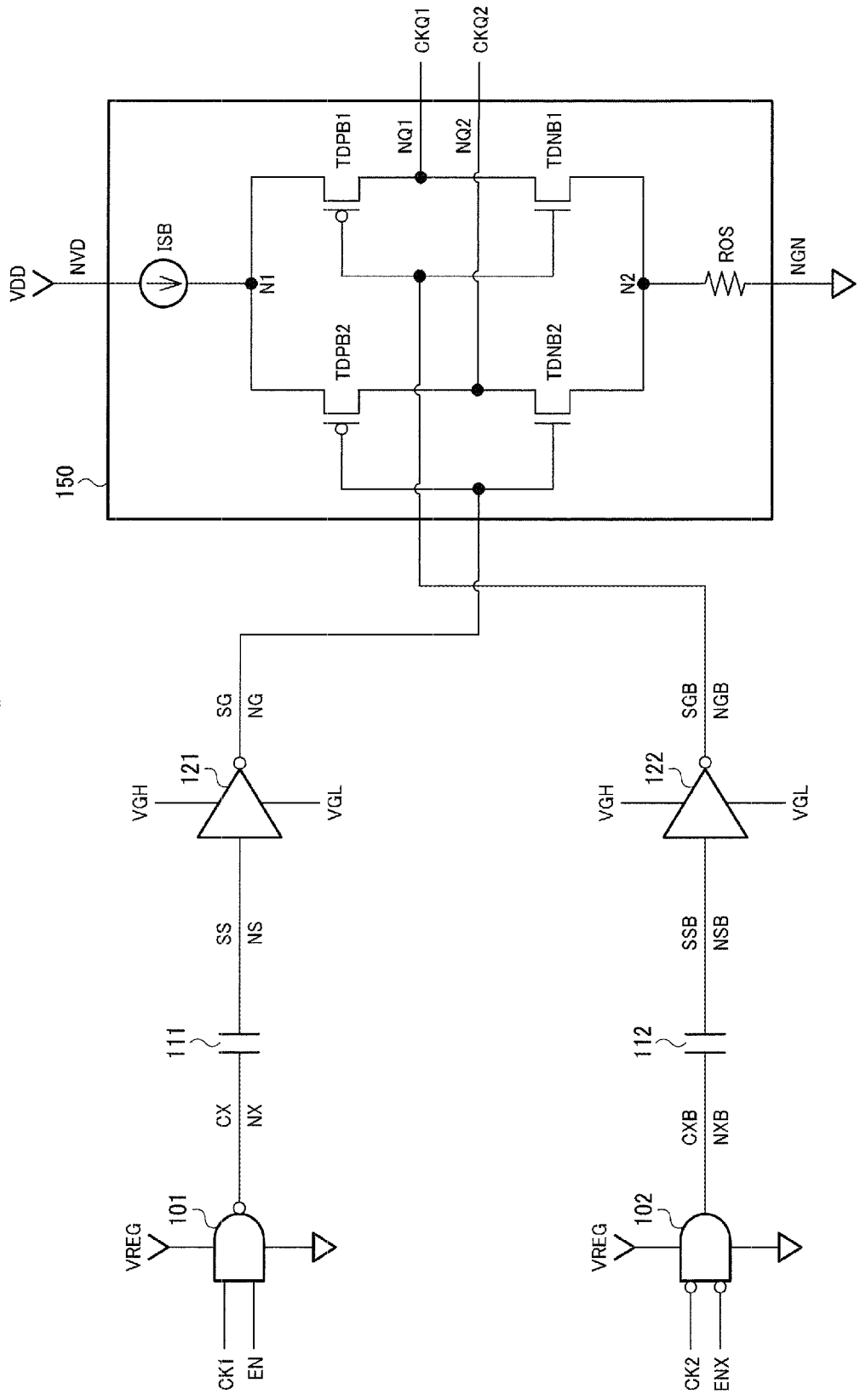
FIG. 7 shows a third configuration example of the output circuit.

FIG. 7 is a third configuration example of the output circuit 80. In FIG. 7, the output circuit 80 outputs clock signals CKQ1 and CKQ2 of the low voltage differential signaling (LVDS) standard.

The output circuit 80 includes logic circuits 101 and 102, capacitors 111 and 112, buffer circuits 121 and 122, and a driver circuit 150. The driver circuit 150 includes a constant current circuit ISB, P-type transistors TDPB1 and TDPB2, N-type transistors TDNB1 and TDNB2, and a resistor ROS. TDPB1, TDPB2, TDNB1, and TDNB2 are a first driver P-type transistor, a second driver P-type transistor, a first driver N-type transistor, and a second driver N-type transistor, respectively.

The constant current circuit ISB is provided between a power supply node NVD and a node N1. The node N1 is a first node. The constant current circuit ISB can be realized by, for example, a current mirror circuit.

The P-type transistor TDPB1 is provided between a node N1 and an output node NQ1. A signal SGB is input to a gate of the P-type transistor TDPB1. Specifically, a source of the P-type transistor TDPB1 is coupled to the node N1, and a drain is coupled to the output node NQ1.

The N-type transistor TDNB1 is provided between the output node NQ1 and a node N2. The signal SGB is input to a gate of the N-type transistor TDNB1. Specifically, a drain of the N-type transistor TDNB1 is coupled to the output node NQ1, and a source is coupled to the node N2. The node N2 is a second node. One end of the resistor ROS is coupled to the node N2, and the other end is coupled to a ground node.

The P-type transistor TDPB2 is provided between the node N1 and an output node NQ2. A signal SG is input to a gate of the P-type transistor TDPB2. Specifically, a source of the P-type transistor TDPB2 is coupled to the node N1, and a drain is coupled to the output node NQ2.

The N-type transistor TDNB2 is provided between the output node NQ2 and the node N2. The signal SG is input to a gate of the N-type transistor TDNB2. Specifically, a drain of the N-type transistor TDNB2 is coupled to the output node NQ2, and a source is coupled to the node N2.

Note that the voltages VGH and VGL supplied to the buffer circuits 121 and 122 are voltages corresponding to the LVDS standard. That is, the voltages VGH and VGL are symmetrical with respect to the center voltage 1.25 V in the clock signal of the LVDS standard. For example, VGH=2 V and VGL=0.5 V are set. Thereby, since the buffer circuits 121 and 122 and the driver circuit 150 operate symmetrically with respect to 1.25 V, the characteristics of the clock signals CKQ1 and CKQ2 which are differential clock signals can be improved. For example, an accurate cross point in the differential clock signal can be realized.

Figure 8:
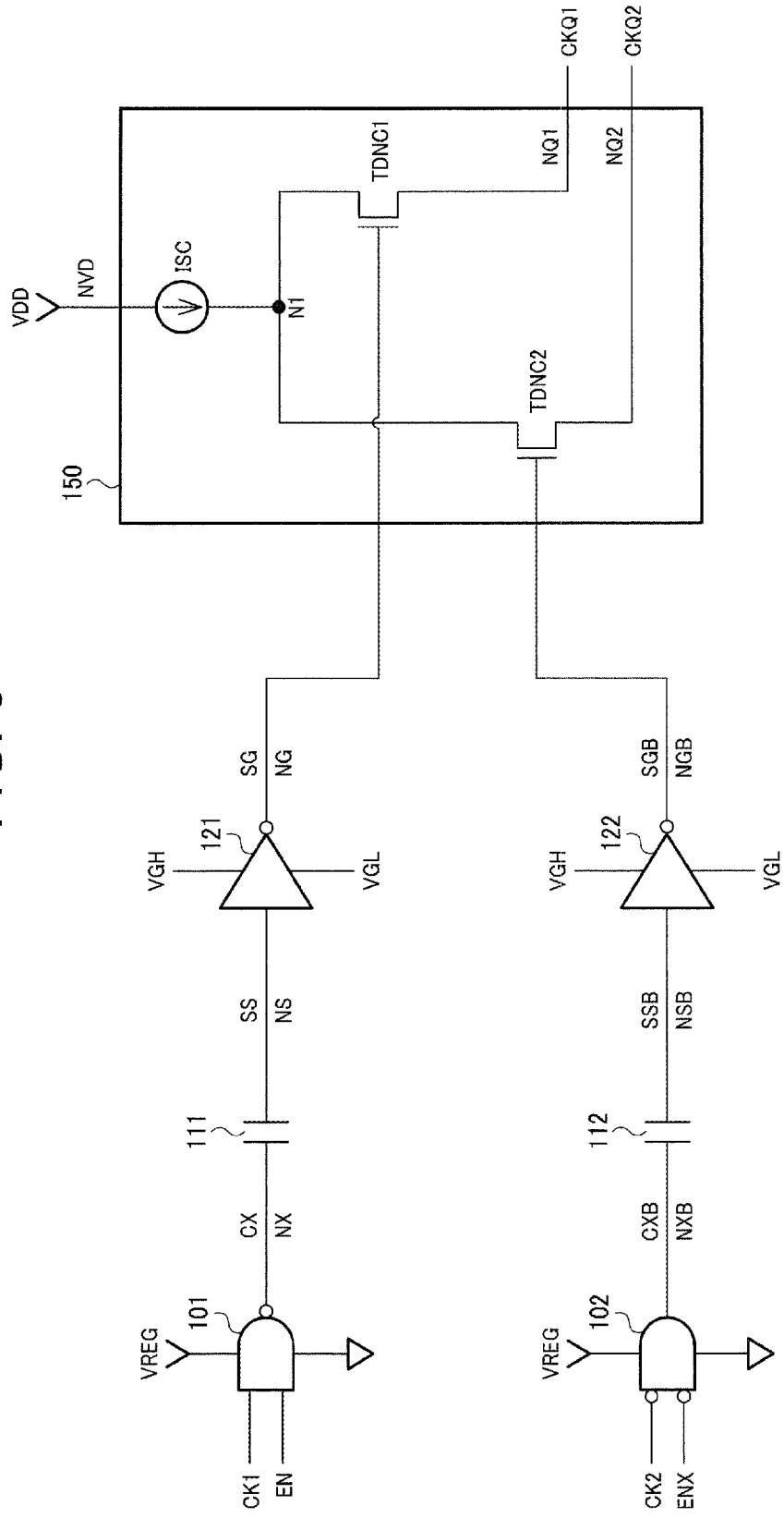
FIG. 8 shows a fourth configuration example of the output circuit.

FIG. 8 is a fourth configuration example of the output circuit 80. In FIG. 8, the output circuit 80 outputs clock signals CKQ1 and CKQ2 of the high-speed current steering logic (HCSL) standard.

The output circuit 80 includes logic circuits 101 and 102, capacitors 111 and 112, buffer circuits 121 and 122, and a driver circuit 150. The driver circuit 150 includes a constant current circuit ISB and N-type transistors TDNC1 and TDNC2. TDNC1 and TDNC2 are a first driver N-type transistor and a second driver N-type transistor, respectively.

The constant current circuit ISC is provided between a power supply node NVD and a node N1. The node N1 is a first node. The constant current circuit ISC can be realized by, for example, a current mirror circuit.

The N-type transistor TDNC1 is provided between the node N1 and an output node NQ1. The signal SG is input to a gate of the N-type transistor TDNC1. Specifically, a drain of the N-type transistor TDNC1 is coupled to the node N1, and a source is coupled to the output node NQ1.

The N-type transistor TDNC2 is provided between the node N1 and an output node NQ2. The signal SGB is input to a gate of the N-type transistor TDNC2. Specifically, a drain of the N-type transistor TDNC2 is coupled to the node N1, and a source is coupled to the output node NQ2.

Note that the voltages VGH and VGL supplied to the buffer circuits 121 and 122 are voltages that turn on or off the N-type transistors TDNC1 and TDNC2, and for example, it is expressed as VGH=2 V and VGL=0 V.

4. Voltage Generation Circuit

Figure 9:
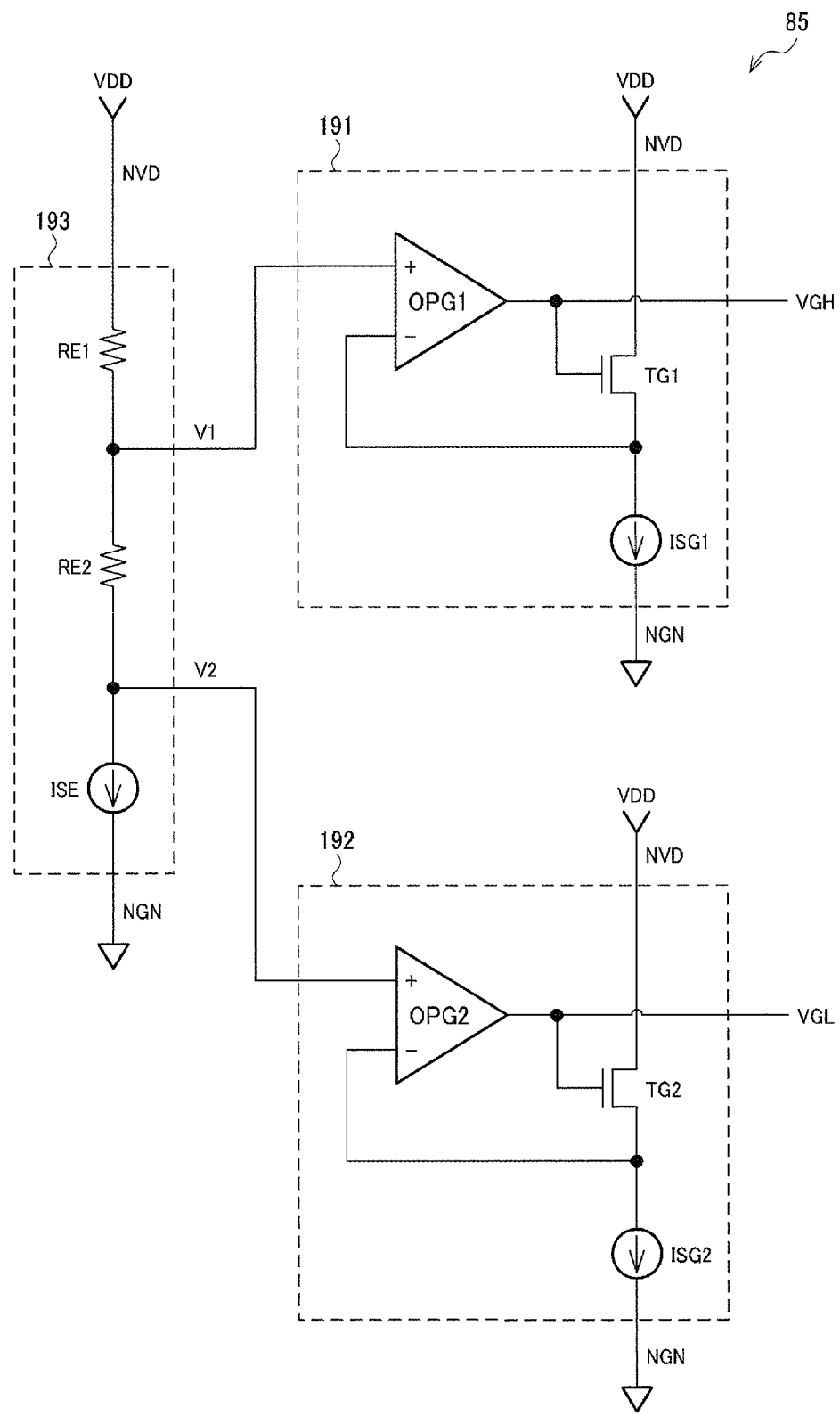
FIG. 9 shows a configuration example of a voltage generation circuit.

FIG. 9 is a configuration example of the voltage generation circuit 85 that generates the voltages VGH and VGL in the first configuration example of the output circuit 80. The voltage generation circuit 85 includes a reference voltage output circuit 193, a first voltage output circuit 191, and a second voltage output circuit 192.

The reference voltage output circuit 193 outputs voltages V1 and V2. The voltage V1 is a voltage corresponding to the voltage VGH. When the clock signal conforms to the PECL standard, the voltage V1 corresponds to a high level voltage, and V2 corresponds to a low level voltage. The reference voltage output circuit 193 includes resistors RE1 and RE2 and a constant current circuit ISE coupled in series between a power supply node NVD and a ground node NGN. The voltage V1 is output from a node between the resistors RE1 and RE2, and the voltage V2 is output from a node between the resistor RE2 and the constant current circuit ISE.

The first voltage output circuit 191 outputs a voltage VGH based on the voltage V1. The first voltage output circuit 191 includes a operational amplifier OPG1, an N-type transistor TG1, and a constant current circuit ISG1. The N-type transistor TG1 and the constant current circuit ISG1 are coupled with each other between the power supply node NVD and the ground node NGN. The voltage V1 is input to the non-inverting input node of the operational amplifier OPG1. A node between the N-type transistor TG1 and the constant current circuit ISG1 is coupled to the inverting input node of the operational amplifier OPG1. With this configuration, the operational amplifier OPG1 outputs the voltage VGH=V1+Vth+ΔVH. Vth is a threshold voltage of the N-type transistor TG1.

The second voltage output circuit 192 outputs a voltage VGL based on the voltage V2. The second voltage output circuit 192 includes a operational amplifier OPG2, an N-type transistor TG2, and a constant current circuit ISG2. The N-type transistor TG2 and the constant current circuit ISG2 are coupled with each other between the power supply node NVD and the ground node NGN. The voltage V2 is input to the non-inverting input node of the operational amplifier OPG2. A node between the N-type transistor TG2 and the constant current circuit ISG2 is coupled to the inverting input node of the operational amplifier OPG2. With this configuration, the operational amplifier OPG2 outputs the voltage VGL=V2+Vth+ΔVL. Vth is a threshold voltage of the N-type transistor TG2.

5. Circuit Device and Oscillator

Figure 10:
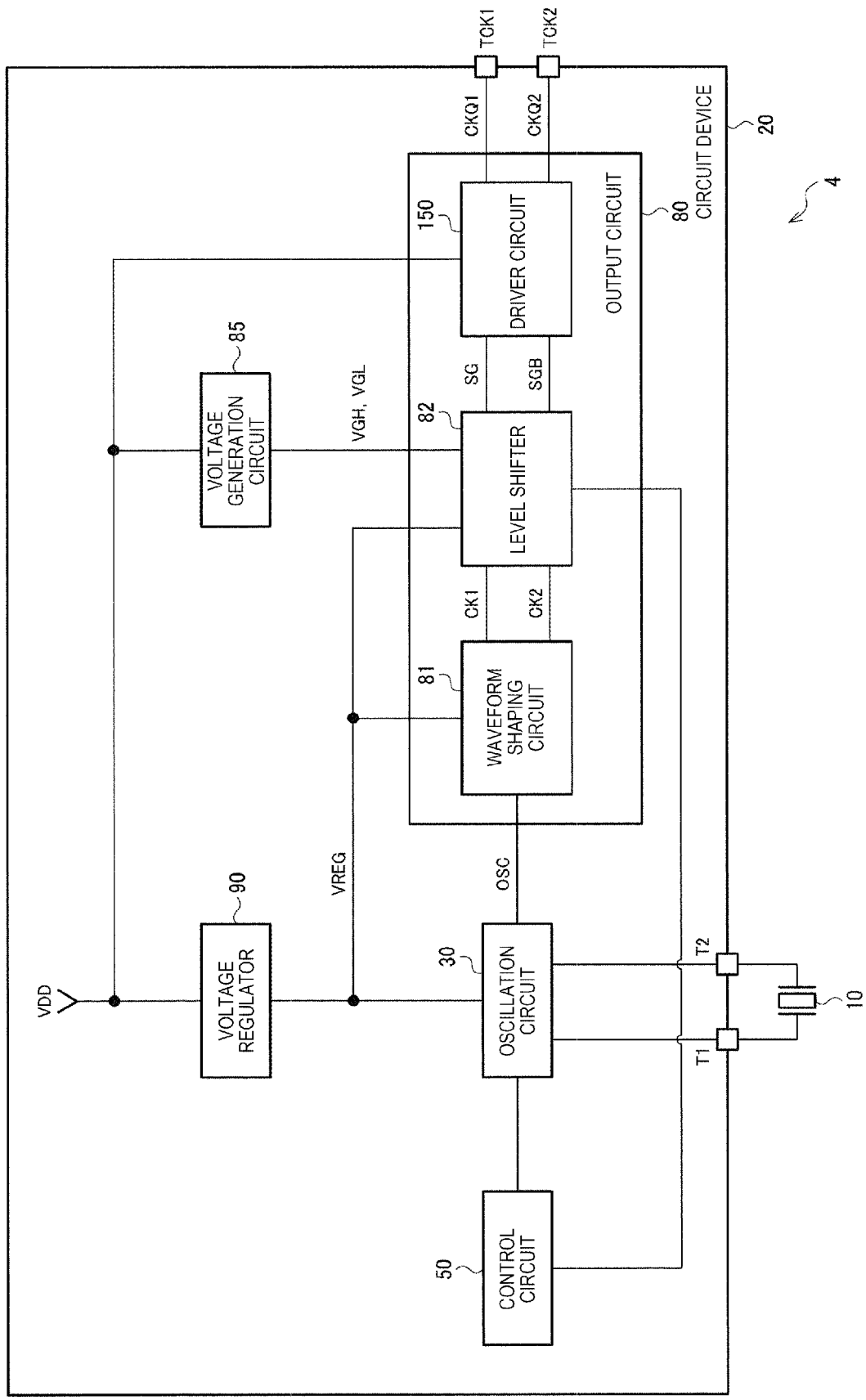
FIG. 10 shows a configuration example of a circuit device and an oscillator.

FIG. 10 is a configuration example of a circuit device 20 and an oscillator 4 including the output circuit 80 of the present embodiment. The oscillator 4 includes the circuit device 20 and a resonator 10. The resonator 10 is electrically coupled to the circuit device 20. For example, the resonator 10 and the circuit device 20 are electrically coupled using an internal wiring, a bonding wire, a metal bump, or the like of a package that accommodates the resonator 10 and the circuit device 20.

The resonator 10 is an element generating mechanical vibration by an electric signal. The resonator 10 can be realized by a resonator element such as a quartz crystal resonator element, for example. Specifically, it can be realized by a quartz crystal resonator element in which a cut angle vibrates in a thickness-shear manner such as an AT cut or an SC cut. The resonator 10 may be realized by various resonator elements such as resonator elements other than a thickness-shear vibration type or piezoelectric resonator elements formed of materials other than quartz crystal. For example, a surface acoustic wave (SAW) resonator, a micro electro mechanical systems (MEMS) resonator formed using a silicon substrate, or the like may be adopted.

The circuit device 20 is an integrated circuit device called an IC. For example, the circuit device 20 is an IC manufactured by a semiconductor process, and is a semiconductor chip in which circuit elements are formed on a semiconductor substrate. The circuit device 20 includes an oscillation circuit 30, a control circuit 50, an output circuit 80, a voltage generation circuit 85, a voltage regulator 90, and terminals T1, T2, TCK1, and TCK2. Note that the present embodiment is not limited to the configuration in FIG. 10, and various modifications such as omitting some of the components or adding other components are possible. For example, the circuit device 20 may further include a non-volatile memory that stores various setting data. Alternatively, when the control circuit 50 performs a temperature compensation of the oscillation frequency, the circuit device 20 may further include a temperature sensor.

The terminals T1, T2, TCK1, and TCK2 are, for example, pads of the circuit device 20. The terminal T1 is electrically coupled to one end of the resonator 10, and the terminal T2 is electrically coupled to the other end of the resonator 10. For example, the resonator 10, and the terminals T1 and T2 are electrically coupled with each other using internal wiring, a bonding wire, a metal bump, or the like of a package that accommodates the resonator 10 and the circuit device 20. The terminals TCK1 and TCK2 are terminals to which the clock signals CKQ1 and CKQ2 generated by the circuit device 20 are output. The terminals TCK1 and TCK2 are electrically coupled to external terminals for external coupling of the oscillator 4. For example, the terminals TCK1 and TCK2, and the external terminals are electrically coupled with each other using the internal wiring, the bonding wire, the metal bump, or the like of the package. The external terminals of the oscillator 4 are electrically coupled to an external device.

The voltage regulator 90 generates the regulated voltage VREG by regulating the power supply voltage VDD. The voltage regulator 90 can be realized by, for example, a negative feedback circuit including a operational amplifier and a resistor.

The oscillation circuit 30 is a circuit that oscillates the resonator 10. For example, the oscillation circuit 30 is electrically coupled to the terminals T1 and T2, and outputs the oscillation signal OSC by causing the resonator 10 to oscillate. As the oscillation circuit 30, various types of oscillation circuits can be used such as a Pierce type, a Colpitts type, an inverter type, or a Hartley type.

The output circuit 80 includes a waveform shaping circuit 81, a level shifter 82, and a driver circuit 150.

The waveform shaping circuit 81 generates clock signals CK1 and CK2 based on the oscillation signal OSC. For example, the waveform shaping circuit 81 includes a circuit that generates a rectangular wave clock signal from the oscillation signal OSC, and a circuit that outputs the clock signals CK1 and CK2 by converting the rectangular wave clock signal into a differential clock signal. Alternatively, the waveform shaping circuit 81 may further include a dividing circuit that divides a rectangular clock signal. In this case, the divided clock signal is converted into a differential clock signal.

The level shifter 82 corresponds to the logic circuits 101 and 102 and the buffer circuits 121 and 122 described with reference to FIG. 1 and the like.

The driver circuit 150 outputs the clock signals CKQ1 and CKQ2 based on the signals SG and SGB from the buffer circuits 121 and 122 as described with reference to FIG. 1 and the like.

The control circuit 50 performs various controls in the circuit device 20. The control circuit 50 controls the level shifter 82. Specifically, the control circuit 50 outputs the enable signal EN, the inverted enable signal ENX, the signal SL, the signal HX, the signal SLB, and the signal HXB to the level shifter 82. Further, the control circuit 50 controls the oscillation circuit 30. For example, the control circuit 50 performs the temperature compensation of the oscillation frequency. That is, the control circuit 50 performs processing for canceling or reducing the temperature characteristics of the oscillation frequency. As a method for realizing the temperature compensation, for example, a method for generating a temperature compensation voltage approximating a polynomial or a method for controlling the fractional division ratio of the fractional-N PLL circuit according to the temperature or a method for using a digital synthesizer or the like, can be assumed. Note that the method for realizing the temperature compensation is also described in FIGS. 11 and 12. The output circuit 80 of the present embodiment can be applied to one or both of the circuit devices 20 and 21 in FIGS. 11 and 12.

Figure 11:
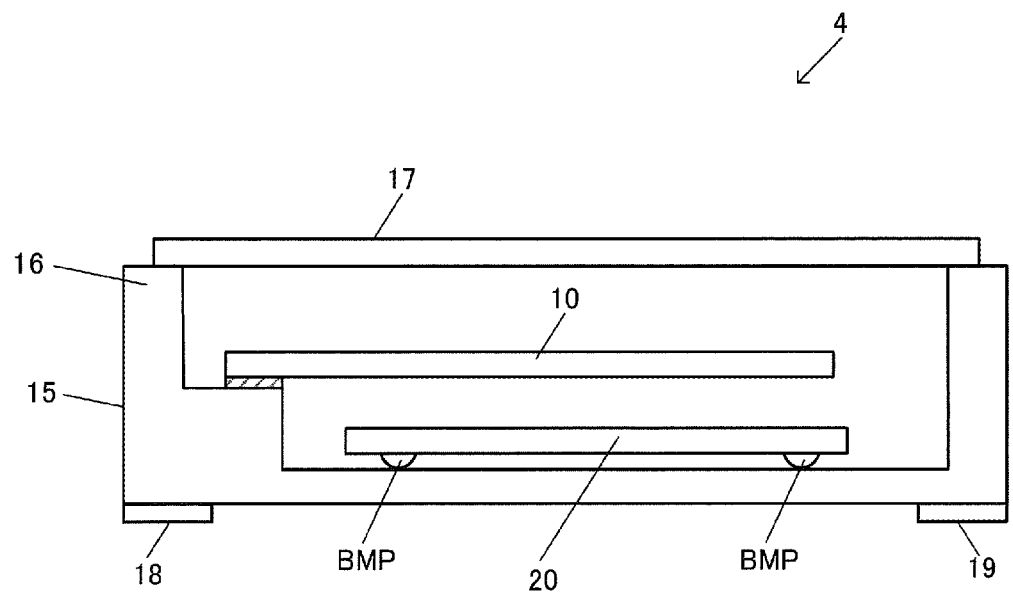
FIG. 11 shows a first structural example of an oscillator.

Next, a structural example of the oscillator 4 of the present embodiment will be described. FIG. 11 shows a first structural example of the oscillator 4. The oscillator 4 has the resonator 10, the circuit device 20, and the package 15 that accommodates the resonator 10 and the circuit device 20. The package 15 is made of, for example, ceramic or the like, and has an accommodation space inside thereof, and the resonator 10 and the circuit device 20 are accommodated in the accommodation space. The accommodation space is hermetically sealed and is preferably in a reduced pressure state that is close to a vacuum state. With the package 15, the resonator 10 and the circuit device 20 can be suitably protected from impact, dust, heat, moisture, and the like.

The package 15 has a base 16 and a lid 17. Specifically, the package 15 includes a base 16 that supports the resonator 10 and the circuit device 20, and a lid 17 that is bonded to the upper surface of the base 16 so as to form an accommodation space with the base 16. And the resonator 10 is supported by the step portion provided inside the base 16 via the terminal electrode. The circuit device 20 is disposed on the inner bottom surface of the base 16. Specifically, the circuit device 20 is disposed such that the active surface faces the inner bottom surface of the base 16. The active surface is a surface on which circuit elements of the circuit device 20 are formed. Further, bumps BMP are formed on terminals that are pads of the circuit device 20. The circuit device 20 is supported on the inner bottom surface of the base 16 via bumps BMP. The bump BMP is, for example, a metal bump and has conductivity. The resonator 10 and the circuit device 20 are electrically coupled with each other via the bump BMP, the internal wiring of the package 15, the terminal electrode, or the like. The circuit device 20 is electrically coupled to the external terminals 18 and 19 of the oscillator 4 via the bumps BMP or the internal wiring of the package 15. The external terminals 18 and 19 are formed on the outer bottom surface of the package 15. The external terminals 18 and 19 are coupled to an external device via the external wirings. The external wiring is, for example, wiring or the like formed on a circuit board on which an external device is mounted. Thereby, a clock signal or the like can be output to the external device.

In FIG. 11, the circuit device 20 is flip-mounted so that the active surface of the circuit device 20 faces downward, but the present embodiment is not limited to such mounting. For example, the circuit device 20 may be mounted so that the active surface of the circuit device 20 faces the resonator 10.

Figure 12:
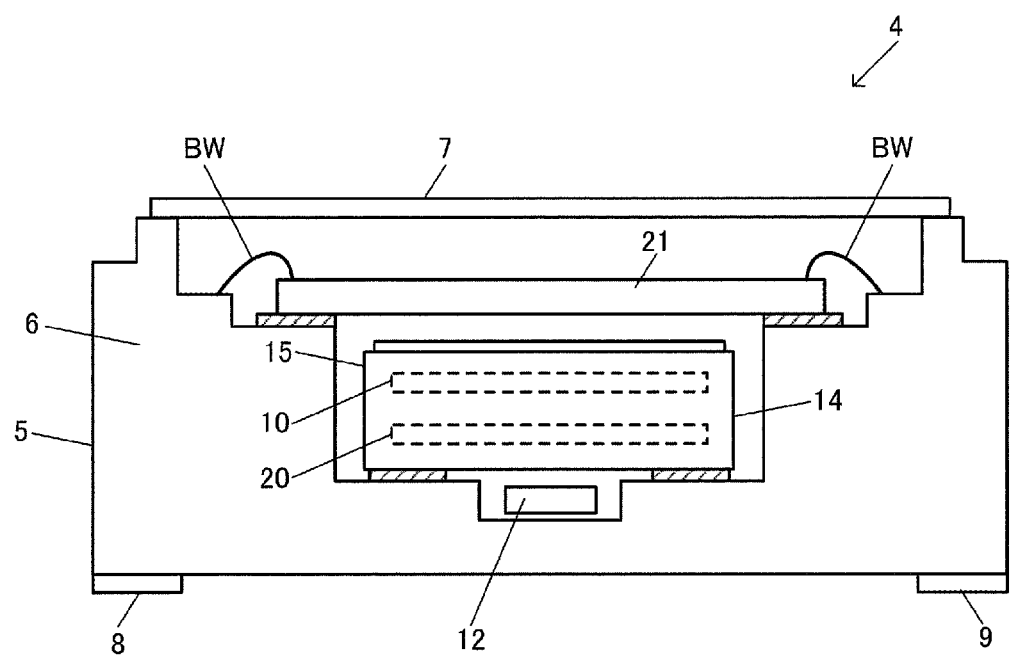
FIG. 12 shows a second structural example of the oscillator.

FIG. 12 shows a second structural example of the oscillator 4. The oscillator 4 in FIG. 12 includes a resonator 10, a circuit device 20, and a circuit device 21. The oscillator 4 also includes the package 15 accommodating the resonator 10 and the circuit device 20, and a package 5 accommodating the package 15 and the circuit device 21. The package 15 and the package 5 are a first package and a second package, respectively.

In the present embodiment, the circuit device 20 accommodated in the package 15 performs the first temperature compensation processing, and the circuit device 21 accommodated in the package 5 performs the second temperature compensation processing. For example, the resonator 10 and the circuit device 20 are accommodated in the package 15, so that a temperature compensation type oscillator 14 that performs, for example, an analog-mode first temperature compensation processing is configured. Further, the oscillator 14 that performs analog-mode first temperature compensation processing and the circuit device 21 that performs digital-mode second temperature compensation processing are accommodated in the package 5, so that the oscillator 4 that generates highly accurate clock signal is configured. The circuit device 21 can also be called a correction IC that performs the second temperature compensation processing with a fine adjustment in a digital-mode.

Specifically, the package 5 is made of, for example, ceramic or the like, and has an accommodation space inside thereof. In this accommodation space, the oscillator 14, in which the resonator 10 and the circuit device 20 are accommodated in the package 15, and the circuit device 21 are accommodated. With the package 5, the circuit device 21 and the oscillator 14 can be suitably protected from impact, dust, heat, moisture, and the like.

The package 5 has a base 6 and a lid 7. Specifically, the package 5 includes a base 6 that supports the oscillator 14 and the circuit device 21, and a lid 7 that is bonded to the upper surface of the base 6 so as to form an accommodation space with the base 6. The base 6 has a first recess portion opening on the upper surface and a second recess portion opening on the bottom surface of the first recess portion inside thereof. The circuit device 21 is supported on the bottom surface of the first recess portion. For example, the circuit device 21 is supported by a step portion on the bottom surface via a terminal electrode. The oscillator 14 is supported on the bottom surface of the second recess portion. For example, the oscillator 14 is supported by the step portion on the bottom surface via the terminal electrode.

Further, the base 6 has a third recess portion opening in the bottom surface of the second recess portion, and the circuit component 12 is disposed in the third recess portion. For example, a capacitor or a temperature sensor can be assumed as the circuit component 12 to be disposed.

The circuit device 21 is electrically coupled to terminals of the oscillator 14 via, for example, a bonding wire BW, a terminal electrode formed in a step portion, or internal wiring of the package 5. Thereby, the clock signal or the temperature detection signal from the oscillator 14 can be input to the circuit device 21. Further, the circuit device 21 is electrically coupled to external terminals 8 and 9 of the oscillator 4 via the bonding wire BW, the terminal electrode formed in the step portion, and the internal wiring of the package 5. The external terminals 8 and 9 are formed on the outer bottom surface of the package 5. The external terminals 8 and 9 are coupled to an external device via the external wirings. The external wiring is, for example, wiring or the like formed on a circuit board on which an external device is mounted. Thereby, a clock signal or the like can be output to the external device. Note that the terminals of the oscillator 14 and the external terminals 8 and 9 may be electrically coupled with each other.

In FIG. 12, the circuit device 21 is disposed in the upward direction of the oscillator 14, but the circuit device 21 may be disposed in the downward direction of the oscillator 14. The upward direction is a direction from the bottom surface of the package 5 toward the lid 7, and the downward direction is the opposite direction. The circuit device 21 may be provided on the side of the oscillator 14. That is, the oscillator 14 and the circuit device 21 are arranged side by side so as to be aligned in an upper surface view of the oscillator 4.

Next, the circuit device 21 will be described. The circuit device 21 includes a clock signal generation circuit to which a first oscillator clock signal that is a clock signal generated by the oscillator 14 is input as a reference clock signal. The clock signal generated by the clock signal generation circuit is output to the outside as an output clock signal of the oscillator 4. For example, the clock signal generation circuit of the circuit device 21 is constituted by a fractional-N PLL circuit to which the first oscillator clock signal from the oscillator 14 is input as a reference clock signal. The PLL circuit performs a phase comparison of a reference clock signal that is a first oscillator clock signal and a feedback clock signal obtained by dividing the output clock signal of the PLL circuit by a frequency dividing circuit. A fractional-N PLL circuit is realized by setting a fractional division ratio using a delta sigma modulator. Further, the control circuit included in the circuit device 21 performs correction processing of the division ratio data set in the PLL circuit based on the temperature compensation data, thereby the second temperature compensation processing is realized. The clock signal generation circuit may be constituted by a direct digital synthesizer. In this case, the second temperature compensation processing is realized by inputting the frequency control data corrected by the temperature compensation data with respect to the direct digital synthesizer that operates using the first oscillator clock signal as a reference clock signal.

According to the oscillator 4 in FIG. 12, the circuit device 20 that oscillates the resonator 10 performs the first temperature compensation processing, thereby the amount of the frequency fluctuation in the frequency-temperature characteristics of the first oscillator clock signal which is output from the circuit device 20 that is a first circuit device, can be reduced. Further, the circuit device 21 that is the second circuit device performs the second temperature compensation processing when the clock signal is generated based on the first oscillator clock signal from the circuit device 20. As described above, the second temperature compensation processing is performed by the circuit device 21 after the first temperature compensation processing is performed by the circuit device 20, thereby it becomes possible, for example, to reduce the micro-jump of frequency caused by fluctuation of the temperature measurement result or the like, and possible to realize the clock frequency of the oscillator 4 with high accuracy or the like. In the oscillator 4 in FIG. 12, the first temperature compensation processing may be performed using a temperature sensor provided in the circuit device 20, and a temperature detection signal of this temperature sensor may be output from the circuit device 20 and input to the circuit device 21. The circuit device 21 may perform the second temperature compensation processing based on the input temperature detection signal. As described above, the first temperature compensation processing in the circuit device 20 and the second temperature compensation processing in the circuit device 21 can be performed based on the temperature detection signal from the same temperature sensor so that more appropriate temperature compensation processing can be realized. In this case, a distance between the temperature sensor built in the circuit device 20 and the resonator 10 is shorter than a distance between the temperature sensor and the circuit device 21. Accordingly, by performing the digital temperature compensation processing, the distance between the circuit device 21 that generates a large amount of heat and the resonator 10 can be increased, and the adverse effect of the heat generated by the circuit device 21 on the temperature detection result of the temperature sensor can be reduced. Therefore, the temperature of the resonator 10 can be measured more accurately using the temperature sensor built in the circuit device 20.

6. Electronic Apparatus and Vehicle

Figure 13:
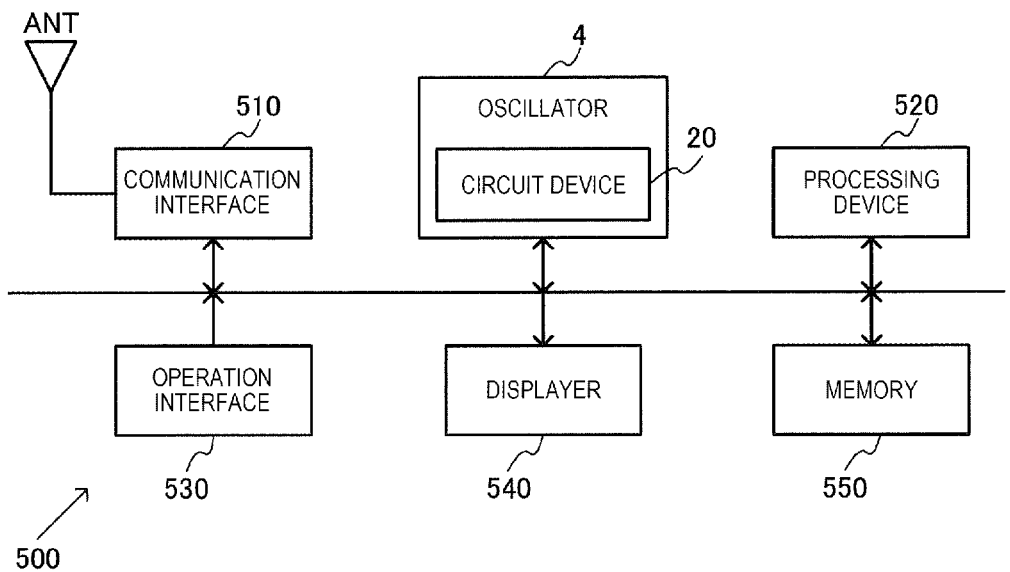
FIG. 13 shows a configuration example of an electronic apparatus.

FIG. 13 shows a configuration example of an electronic apparatus 500 including the circuit device 20 of the present embodiment. The electronic apparatus 500 includes the circuit device 20 of the present embodiment and a processing device 520 that operates by a clock signal based on the oscillation signal of the oscillation circuit 30 of the circuit device 20. Specifically, the electronic apparatus 500 includes the oscillator 4 having the circuit device 20 of the present embodiment, and the processing device 520 operates based on the clock signal from the oscillator 4. The electronic apparatus 500 can include an antenna ANT, a communication interface 510, an operation interface 530, a displayer 540, and a memory 550. The electronic apparatus 500 is not limited to the configuration shown in FIG. 13, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the circuit device 20 of the present embodiment can be used in various apparatuses such as a base station, a remote radio head (RRH), or a mobile communication terminal of a next generation mobile communication system. In the next generation mobile communication system, a highly accurate clock frequency is required, for example, for time synchronization, which is suitable as an application example of the circuit device 20 of the present embodiment that can generate a highly accurate clock signal.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

Figure 14:
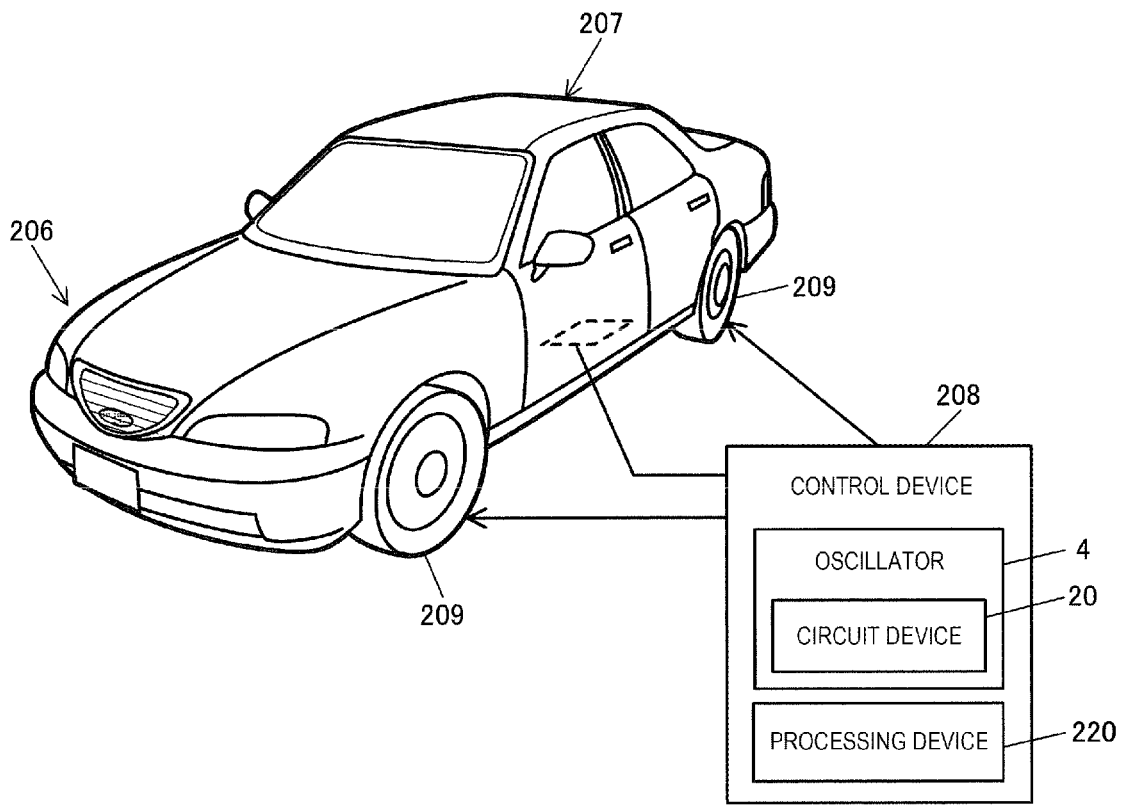
FIG. 14 shows a configuration example of a vehicle.

FIG. 14 shows an example of a vehicle including the circuit device 20 of the present embodiment. The vehicle includes the circuit device 20 of the present embodiment and a processing device 220 that operates by a clock signal based on an oscillation signal of the oscillation circuit 30 of the circuit device 20. Specifically, the vehicle includes the oscillator 4 having the circuit device 20 of the present embodiment, and the processing device 220 operates based on the clock signal from the oscillator 4. The circuit device 20 of the present embodiment can be incorporated into various vehicles such as vehicles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 14 schematically shows an automobile 206 as a specific example of the vehicle. The automobile 206 incorporates the circuit device 20 of the present embodiment. Specifically, the automobile 206 that is a vehicle includes a control device 208, and the control device 208 includes the oscillator 4 including the circuit device 20 of the present embodiment and a processing device 220 operating based on a clock signal generated by the oscillator 4. The control device 208, for example, controls the hardness of the suspension according to the attitude of a vehicle body 207, and controls brakes of the individual wheels 209. For example, automatic driving of the automobile 206 may be realized by the control device 208. The apparatus in which the circuit device 20 of the present embodiment is incorporated is not limited to such a control device 208, and can be incorporated in various in-vehicle apparatuses such as an instrument panel apparatus and a navigation apparatus provided in a vehicle such as an automobile 206.

As described above, an output circuit according to the present embodiment includes a first logic circuit, a first capacitor, a first buffer circuit, and a driver circuit. The first logic circuit receives a first clock signal and outputs a clock signal based on the first clock signal when the enable signal is active. The first buffer circuit receives a first logic circuit output signal that is an output signal of the first logic circuit via the first capacitor. The driver circuit outputs a first output clock signal based on a first buffer circuit output signal that is an output signal of the first buffer circuit. The first logic circuit sets a level of the first logic circuit output signal to the same logic level as a first buffer circuit input node that is an input node of the first buffer circuit when the enable signal is inactive.

According to the present embodiment, since the first logic circuit output signal is input to the first buffer circuit via the first capacitor, the first logic circuit output signal is DC cut by the first capacitor. Thereby, various voltages can be used for the power supply of the first logic circuit and the power supply of the first buffer circuit, so that various voltage specifications can be accommodated. Further, since the first logic circuit output signal is set to the same logic level as the first buffer circuit input node when the enable signal is inactive, the logic level of the signal is the same at both ends of the first capacitor. Thereby, an appropriate signal level is input to the first buffer circuit, so that the output circuit can output an appropriate first clock signal.

In the present embodiment, the first buffer circuit may include a first inverter and a first latch circuit. The first inverter may receive the first logic circuit output signal via the first capacitor. The first latch circuit may perform a latch operation by setting the first buffer circuit input node to a logic inversion level of an output signal of the first inverter.

Since the first capacitor is provided between the first logic circuit output node and the first buffer circuit input node, the first buffer circuit input node may be a momentarily unstable state when the first clock signal has a low frequency. In this regard, according to the present embodiment, the first latch circuit performs a latch operation so that the logic level of the first buffer circuit input node is set.

In the present embodiment, the output circuit may include a second logic circuit, a second capacitor, and a second buffer circuit. The second logic circuit may receive a differential second clock signal with respect to the first clock signal and output a clock signal based on a second clock signal when the enable signal is active. The second buffer circuit may receive a second logic circuit output signal that is an output signal of the second logic circuit via the second capacitor. The driver circuit may output the first output clock signal and the second output clock signal based on the first buffer circuit output signal and the second buffer circuit output signal that is an output signal of the second buffer circuit. The second output clock signal may be a differential clock signal with respect to the first output clock signal. The second buffer circuit may set the level of the second logic circuit output signal to the same logic level as the second buffer circuit input node that is an input node of the second buffer circuit when the enable signal is inactive.

In this way, since the second logic circuit output signal is input to the second buffer circuit via the second capacitor, the second logic circuit output signal is DC cut by the second capacitor. Thereby, various voltages can be used for the power supply of the second logic circuit and the power supply of the second buffer circuit, so that various voltage specifications can be accommodated. Further, the second buffer circuit input node is set to the same logic level as the second logic circuit output signal when the enable signal is inactive, so that the logic level of the signal is the same at both ends of the second capacitor. Thereby, an appropriate signal level is input to the second buffer circuit, so that the output circuit can output an appropriate second clock signal.

In the present embodiment, the first buffer circuit may include a first inverter and a first latch circuit. The first inverter may receive the first logic circuit output signal via the first capacitor. The first latch circuit may perform a latch operation by setting the first buffer circuit input node to a logic inversion level of an output signal of the first inverter. The second buffer circuit may include a second inverter and a second latch circuit. The second inverter may receive the second logic circuit output signal via the second capacitor. The second latch circuit may perform a latch operation by setting the second buffer circuit input node to a logic inversion level of an output signal of the second inverter.

Since the second capacitor is provided between the second logic circuit output node and the second buffer circuit input node, the second buffer circuit input node may be a momentarily unstable state when the second clock signal has a low frequency. In this regard, according to the present embodiment, the second latch circuit performs a latch operation so that the logic level of the second buffer circuit input node is set.

In the present embodiment, the first logic circuit may be a NAND circuit. The NAND circuit may output the NAND of the first clock signal and the enable signal as the first logic circuit output signal. The second logic circuit may be a NOR circuit. The NOR circuit may output the NOR of the second clock signal and the logic inverted signal of the enable signal as the second logic circuit output signal.

Since the first output clock signal and the second output clock signal are differentials, it is desirable to stop the first output clock signal and the second output clock signal in a differential state when the enable signal is inactive. According to the present embodiment, the first logic circuit outputs a high level, and the second logic circuit outputs a low level. At this time, since the first inverter outputs the low level and the second inverter outputs the high level, the first output clock signal and the second output clock signal can be stopped in a differential state. The logic levels at both ends of the first capacitor are the same. Similarly, the logic levels at both ends of the second capacitor are the same.

In the present embodiment, the driver circuit may output a first output clock signal of the PECL standard.

The clock signal of the PECL standard is output with reference to a power supply voltage. On the other hand, as the power supply of the first logic circuit, for example, an internal power supply or the like of a circuit device may be adopted. According to the present embodiment, since the first logic circuit output signal is input to the first buffer circuit via the first capacitor, various voltage specifications can be supported for the power supply of the first logic circuit and the power supply voltage that is the reference of the clock signal of the PECL standard.

In the present embodiment, the driver circuit may include a first driver N-type transistor. The first driver N-type transistor may be provided between a power supply node and a first output node of the output circuit, and have a gate to which the first buffer circuit output signal or the second buffer circuit output signal is input.

In this way, the driver circuit that outputs the first output clock signal of the PECL standard can be realized.

In the present embodiment, the driver circuit may output a first output clock signal and a second output clock signal of the LVDS standard.

In the present embodiment, the driver circuit outputs a clock signal having a voltage defined in the LVDS standard. At this time, it is desirable that the first buffer circuit and the second buffer circuit operate with an appropriate power source corresponding to the voltage of the clock signal. According to the present embodiment, the first logic circuit output signal is input to the first buffer circuit via the first capacitor, and the second logic circuit output signal is input to the second buffer circuit via the second capacitor, thereby, various voltage specifications can be supported according to the clock signal of the LVDS standard.

In the present embodiment, the driver circuit may include a constant current circuit, a first driver P-type transistor, a first driver N-type transistor, a second driver P-type transistor, and a second driver N-type transistor. The constant current circuit may be provided between a power supply node and a first node. The first driver P-type transistor may be provided between the first node and a first output node of the output circuit, and have a gate to which the first buffer circuit output signal or the second buffer circuit output signal is input. The first driver N-type transistor may be provided between the first output node and a ground node, and have a gate to which the first buffer circuit output signal or the second buffer circuit output signal is input. The second driver P-type transistor may be provided between the first node and a second output node of the output circuit, and have a gate to which the second buffer circuit output signal or the first buffer circuit output signal is input. The second driver N-type transistor may be provided between the second output node and a ground node, and have a gate to which the second buffer circuit output signal or the first buffer circuit output signal is input.

In this way, a driver circuit that outputs the first output clock signal and the second output clock signal of the LVDS standard can be realized.

In the present embodiment, the driver circuit may output a first output clock signal and a second output clock signal of the HCSL standard.

In the present embodiment, the driver circuit outputs a clock signal having a voltage defined in the HCSL standard. At this time, it is desirable that the first buffer circuit and the second buffer circuit operate with an appropriate power source corresponding to the voltage of the clock signal. According to the present embodiment, the first logic circuit output signal is input to the first buffer circuit via the first capacitor, and the second logic circuit output signal is input to the second buffer circuit via the second capacitor, thereby, various voltage specifications can be supported according to the clock signal of the HCSL standard.

In the present embodiment, the driver circuit may include a constant current circuit, a first driver N-type transistor, and a second driver N-type transistor. The constant current circuit maybe provided between a power supply node and a first node. The first driver N-type transistor may be provided between the first node and a first output node of the output circuit, and have a gate to which the first buffer circuit output signal or the second buffer circuit output signal is input. The second driver N-type transistor may be provided between the first node and a second output node of the output circuit, and have a gate to which the second buffer circuit output signal or the first buffer circuit output signal is input.

In this way, a driver circuit that outputs the first output clock signal and the second output clock signal of the HCSL standard can be realized.

In the present embodiment, the first buffer circuit may include a first P-type transistor, a second P-type transistor, a first N-type transistor, a second N-type transistor, a third P-type transistor, a third N-type transistor, a fourth P-type transistor, and a fourth N-type transistor. The first P-type transistor and the second P-type transistor may be electrically coupled in series between a first voltage node to which a first voltage corresponding to a high level of the first output clock signal is input and a first buffer circuit output node that is an output node of the first buffer circuit. The first N-type transistor and the second N-type transistor may be electrically coupled in series between a second voltage node to which a second voltage corresponding to a low level of the first output clock signal is input and a first buffer circuit output node. The third P-type transistor may be provided between the first voltage node and the first buffer circuit output node. The third N-type transistor may be provided between the second voltage node and the first buffer circuit output node. The fourth P-type transistor may be provided between the first voltage node and the first buffer circuit input node. The fourth N-type transistor may be provided between the second voltage node and the first buffer circuit input node. The first logic circuit may output a first logic circuit output signal to gates of the second P-type transistor and the second N-type transistor via the first capacitor. A first output enable signal that is a low level when the enable signal is inactive and a high level when the enable signal is active, may be input to gates of the first P-type transistor and the third N-type transistor. A high level may be input to gates of the first N-type transistor and the third P-type transistor. Gates of the fourth P-type transistor and the fourth N-type transistor may be electrically coupled to the first buffer circuit output node.

In this way, the fourth P-type transistor is ON and the fourth N-type transistor is OFF when the first buffer circuit output signal is at a low level. Thereby, the first buffer circuit input node is set to the high level via the fourth P-type transistor. The fourth P-type transistor is OFF and the fourth N-type transistor is ON when the first buffer circuit output signal is at a high level. Thereby, the first buffer circuit input node is set to the high level via the fourth N-type transistor. Thus, the function of the first latch circuit is realized by the fourth P-type transistor and the fourth N-type transistor. According to the present embodiment, when the enable signal is inactive, since the first P-type transistor and the first N-type transistor are ON, the first inverter is in an operation state. In this way, the function of the first inverter is realized by the first P-type transistor and the first N-type transistor.

A circuit device of the present embodiment includes an oscillation circuit that oscillates the resonator, and an output circuit according to above that outputs a first output clock signal based on the oscillation signal of the oscillation circuit.

An oscillator according to the present embodiment includes the above-described circuit device and a resonator.

An electronic apparatus according to the present embodiment includes the above-described circuit device and a processing device that operates in accordance with a first output clock signal from the circuit device.

A vehicle according to the present embodiment includes the above-described circuit device and a processing device that operates in accordance with a first output clock signal from the circuit device.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configuration, operation, and the like of the output circuit, circuit device, oscillator, electronic apparatus, vehicle, and the like are not limited to those described in the present embodiment, and various modifications can be made.

What is claimed is:

1. An output circuit comprising:
   a first logic circuit receiving a first clock signal and outputting a clock signal based on the first clock signal when an enable signal is active;
   a first capacitor;
   a first buffer circuit to which a first logic circuit output signal that is an output signal of the first logic circuit is input via the first capacitor; and
   a driver circuit outputting a first output clock signal based on a first buffer circuit output signal that is an output signal of the first buffer circuit, wherein
   the first logic circuit sets the first logic circuit output signal to the same logic level as a first buffer circuit input node that is an input node of the first buffer circuit when the enable signal is inactive.

2. The output circuit according to claim 1, wherein the first buffer circuit includes
   a first inverter to which the first logic circuit output signal is input via the first capacitor, and
   a first latch circuit that performs a latch operation by setting the first buffer circuit input node to a logic inversion level of an output signal of the first inverter.

3. The output circuit according to claim 1, further comprising:
   a second logic circuit receiving a second clock signal that is differential with respect to the first clock signal, and outputting a clock signal based on the second clock signal when the enable signal is active;
   a second capacitor; and
   a second buffer circuit to which a second logic circuit output signal that is an output signal of the second logic circuit is input via the second capacitor, wherein
   the driver circuit outputs the first output clock signal and a second output clock signal that is differential with respect to the first output clock signal based on the first buffer circuit output signal and a second buffer circuit output signal that is an output signal of the second buffer circuit, and
   the second logic circuit sets the second logic circuit output signal to the same logic level as a second buffer circuit input node that is an input node of the second buffer circuit when the enable signal is inactive.

4. The output circuit according to claim 3, wherein the first buffer circuit includes
   a first inverter to which the first logic circuit output signal is input via the first capacitor, and
   a first latch circuit that performs a latch operation by setting the first buffer circuit input node to a logic inversion level of an output signal of the first inverter, and
   the second buffer circuit includes
   a second inverter to which the second logic circuit output signal is input via the second capacitor, and
   a second latch circuit that performs a latch operation by setting the second buffer circuit input node to a logic inversion level of an output signal of the second inverter.

5. The output circuit according to claim 3, wherein
   the first logic circuit is a NAND circuit that outputs the NAND of the first clock signal and the enable signal as the first logic circuit output signal, and
   the second logic circuit is a NOR circuit that outputs the NOR of the second clock signal and a logic inverted signal of the enable signal as the second logic circuit output signal.

6. The output circuit according to claim 1, wherein the driver circuit outputs the first output clock signal of the positive emitter coupled logic (PECL) standard.

7. The output circuit according to claim 6, wherein the driver circuit includes a first driver N-type transistor provided between a power supply node and a first output node of the output circuit and having a gate to which the first buffer circuit output signal or the second buffer circuit output signal is input.

8. The output circuit according to claim 3, wherein the driver circuit outputs the first output clock signal and the second output clock signal of the low voltage differential signaling (LVDS) standard.

9. The output circuit according to claim 8, wherein the driver circuit includes
   a constant current circuit provided between a power supply node and a first node,
   a first driver P-type transistor provided between the first node and a first output node of the output circuit and having a gate to which the first buffer circuit output signal or the second buffer circuit output signal is input,
   a first driver N-type transistor provided between the first output node and a ground node and having a gate to which the first buffer circuit output signal or the second buffer circuit output signal is input,
   a second driver P-type transistor provided between the first node and a second output node of the output circuit and having a gate to which the second buffer circuit output signal or the first buffer circuit output signal is input, and
   a second driver N-type transistor provided between the second output node and the ground node and having a gate to which the second buffer circuit output signal or the first buffer circuit output signal is input.

10. The output circuit according to claim 3, wherein the driver circuit outputs the first output clock signal and the second output clock signal of the high-speed current steering logic (HCSL) standard.

11. The output circuit according to claim 10, wherein the driver circuit includes
    a constant current circuit provided between a power supply node and a first node,
    a first driver N-type transistor provided between the first node and a first output node of the output circuit and having a gate to which the first buffer circuit output signal or the second buffer circuit output signal is input, and
    a second driver N-type transistor provided between the first node and a second output node of the output circuit and having a gate to which the second buffer circuit output signal or the first buffer circuit output signal is input.

12. The output circuit according to claim 1, wherein the first buffer circuit includes
    a first P-type transistor and a second P-type transistor electrically coupled in series between a first voltage node to which a first voltage corresponding to a high level of the first output clock signal is input and a first buffer circuit output node that is an output node of the first buffer circuit,
a first N-type transistor and a second N-type transistor electrically coupled in series between a second voltage node to which a second voltage corresponding to a low level of the first output clock signal is input and the first buffer circuit output node,
a third P-type transistor provided between the first voltage node and the first buffer circuit output node,
a third N-type transistor provided between the second voltage node and the first buffer circuit output node,
a fourth P-type transistor provided between the first voltage node and the first buffer circuit input node, and
a fourth N-type transistor provided between the second voltage node and the first buffer circuit input node,
the first logic circuit outputs the first logic circuit output signal to gates of the second P-type transistor and the second N-type transistor via the first capacitor,
a first output enable signal that is a low level when the enable signal is inactive and a high level when the enable signal is active, is input to gates of the first P-type transistor and the third N-type transistor,
a high level is input to gates of the first N-type transistor and the third P-type transistor, and
gates of the fourth P-type transistor and the fourth N-type transistor are electrically coupled to the first buffer circuit output node.

13. A circuit device comprising:
an oscillation circuit oscillating a resonator; and
the output circuit according to claim 1 that outputs the first output clock signal based on an oscillation signal of the oscillation circuit.

14. An oscillator comprising:
the circuit device according to claim 13; and
the resonator.

15. An electronic apparatus comprising:
the circuit device according to claim 13; and
a processing device operating in accordance with the first output clock signal from the circuit device.

16. A vehicle comprising:
the circuit device according to claim 13; and
a processing device operating in accordance with the first output clock signal from the circuit device.

* * * * *